(12) United States Patent
Takahashi et al.

(10) Patent No.: US 7,974,729 B2
(45) Date of Patent: Jul. 5, 2011

(54) SERVER DEVICE AND PROGRAM WITH SUB-RECIPE MEASUREMENT COMMUNICATION

(75) Inventors: Masashi Takahashi, Hokkaido (JP); Minoru Obata, Yamanashi (JP); Noriaki Koyama, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 336 days.

(21) Appl. No.: 12/375,590

(22) PCT Filed: Jul. 9, 2007

(86) PCT No.: PCT/JP2007/063666
§ 371 (c)(1), (2), (4) Date: Jan. 29, 2009

(87) PCT Pub. No.: WO2008/015881
PCT Pub. Date: Feb. 7, 2008

(65) Prior Publication Data
US 2009/0276076 A1    Nov. 5, 2009

(30) Foreign Application Priority Data

Aug. 1, 2006 (JP) ................................. 2006-209424

(51) Int. Cl.
*G06F 19/00* (2011.01)
(52) U.S. Cl. .......... 700/121; 700/28; 700/108; 700/109; 700/110
(58) Field of Classification Search .......... 700/28, 700/108–110, 121
See application file for complete search history.

(56) References Cited

U.S. PATENT DOCUMENTS

| | | | | |
|---|---|---|---|---|
| 6,907,306 B2 * | 6/2005 | Hsieh et al. | ................... | 700/108 |
| 7,146,237 B2 * | 12/2006 | Lev-Ami et al. | ............... | 700/121 |
| 7,353,078 B2 * | 4/2008 | Chung et al. | .................. | 700/121 |
| 7,529,642 B2 * | 5/2009 | Raymond | ..................... | 702/182 |
| 2004/0111416 A1 * | 6/2004 | Kingham et al. | ............... | 707/10 |
| 2007/0038324 A1 * | 2/2007 | Takizawa et al. | ............. | 700/105 |

FOREIGN PATENT DOCUMENTS

| | | | |
|---|---|---|---|
| JP | 07-297257 A | | 11/1995 |
| JP | 08-203794 A | | 8/1996 |
| JP | 09082589 A | * | 3/1997 |
| JP | 11-354395 A | | 12/1999 |
| JP | 2002-025997 A | | 1/2002 |
| JP | 2006-146459 A | | 6/2006 |

OTHER PUBLICATIONS

International Search Report for PCT/JP2007/063666 dated Sep. 27, 2007.

* cited by examiner

*Primary Examiner* — Michael D Masinick
(74) *Attorney, Agent, or Firm* — Pearne & Gordon LLP

(57) ABSTRACT

A server device is provided with a measurement information storage unit 1201 which can store plural measurement information, i.e., information having a measurement value and time information indicating time; an instruction receiving unit for receiving an output instruction of the measurement information; a measurement information acquisition unit for acquiring, from the measurement information storage unit, the measurement information designated by the output instruction; an output information composing unit for composing output information by using the acquired measurement information; and an output unit for outputting the output information composed by the output information composing unit. The output instruction includes an instruction for designating one or more desired number of times of execution of a sub-recipe among plural number of times of execution of the sub-recipe in the recipe and the measurement information acquisition unit acquires measurement information corresponding to the sub-recipe designated by the output instruction.

15 Claims, 15 Drawing Sheets

| S4 | SR02 | SRS005 | 255 | 2005/12/02 16:55:07 |
|---|---|---|---|---|
| STEP IDENTIFIER | SUB-RECIPE IDENTIFIER | SUB-RECIPE STEP IDENTIFIER | GAS FLOW RATE (VALUE) | TIME INFORMATION |

FIG. 3
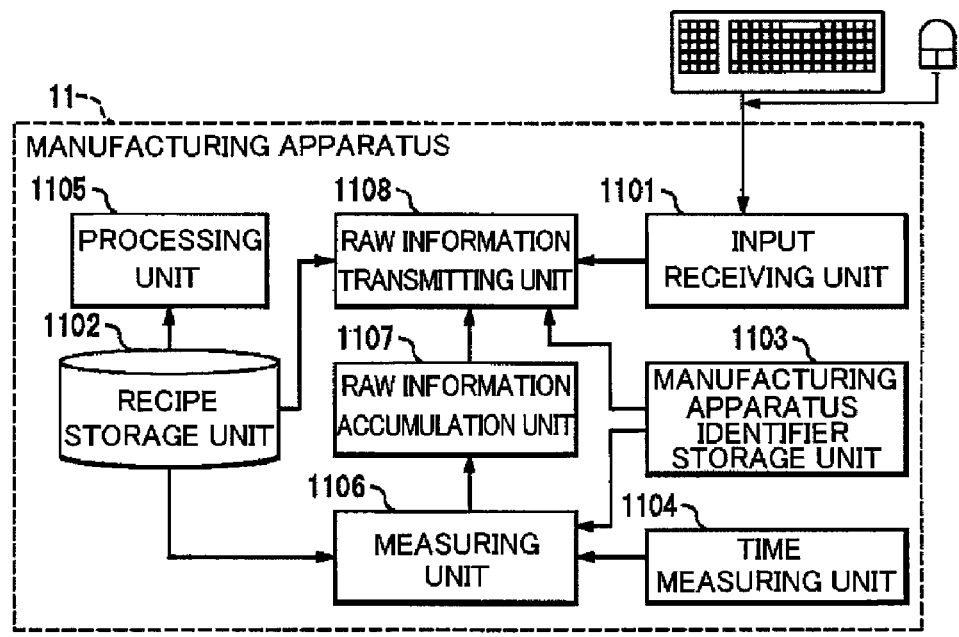
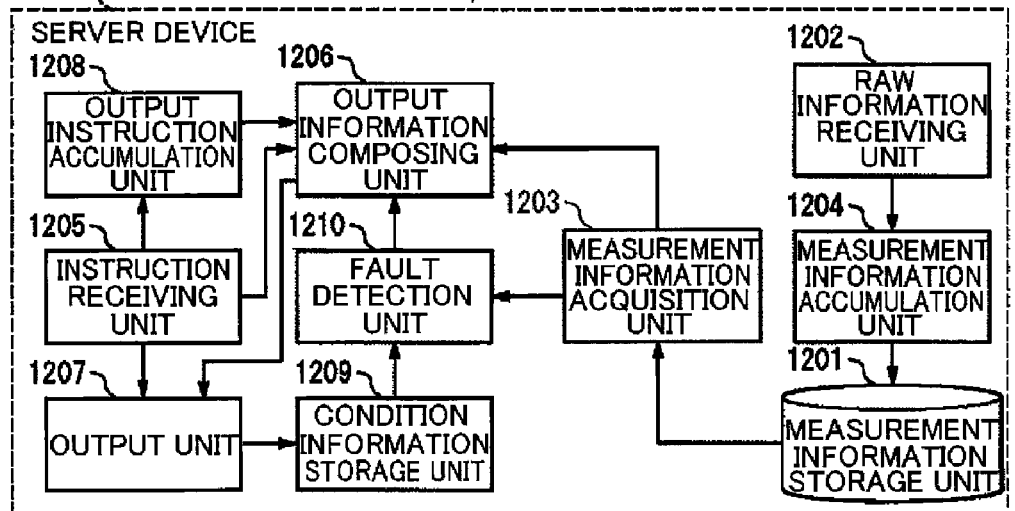
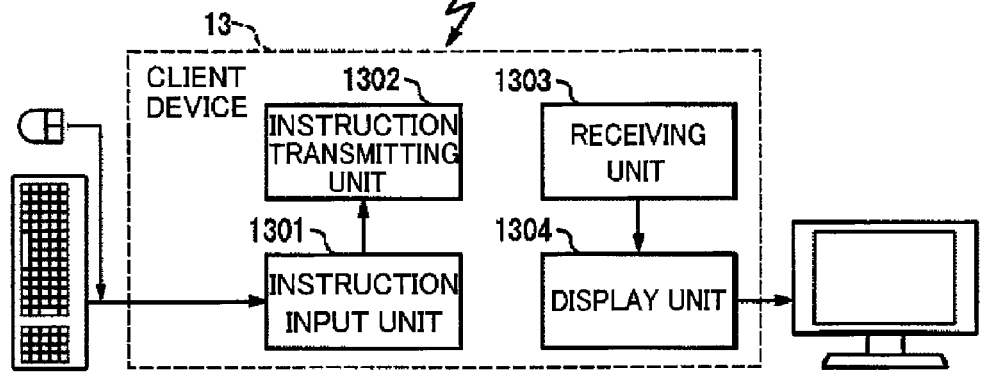

FIG. 7

| RECIPE IDENTIFIER | STEP IDENTIFIER | PROCESSING CONDITION |
|---|---|---|
| R1 | S1 | PROCESSING TEMPERATURE: 300, PROCESSING TIME ······ PRESSURE: 15, GAS FLOW RATE: 0 ······ |
| | S2 | SR02 |
| | S3 | PROCESSING TEMPERATURE: 310, PROCESSING TIME ······ PRESSURE: 10, GAS FLOW RATE: 0 ······ |
| | S4 | SR02 |
| | S5 | SR02 |
| | S6 | PROCESSING TEMPERATURE: 370, PROCESSING TIME ······ PRESSURE: 1, GAS FLOW RATE: 18 ······ |
| | ⋮ | ⋮ |
| R2 | S1 | PROCESSING TEMPERATURE: 300, PROCESSING TIME ····· PRESSURE: 15, GAS FLOW RATE: 0 ······ |
| | ⋮ | ⋮ |
| ⋮ | ⋮ | ⋮ |

FIG. 8

| SUB-RECIPE IDENTIFIER | SUB-RECIPE STEP IDENTIFIER | PROCESSING CONDITION |
|---|---|---|
| SR1 | SRS01 | PROCESSING TEMPERATURE: 300, PROCESSING TIME ······ PRESSURE: 15, GAS FLOW RATE ······ |
| | SRS02 | PROCESSING TEMPERATURE: 330, PROCESSING TIME ······ PRESSURE: 10, GAS FLOW RATE ······ |
| | SRS03 | PROCESSING TEMPERATURE: 320, PROCESSING TIME ······ PRESSURE: 10, GAS FLOW RATE ······ |
| SR2 | SRS04 | PROCESSING TEMPERATURE: 310, PROCESSING TIME ······ PRESSURE: 1, GAS FLOW RATE ······ |
| | SRS05 | PROCESSING TEMPERATURE: 320, PROCESSING TIME ······ PRESSURE: 1.5, GAS FLOW RATE ····· |
| SR3 | SRS06 | PROCESSING TEMPERATURE: 360, PROCESSING TIME ······ PRESSURE: 10, GAS FLOW RATE ······ |
| | SRS07 | PROCESSING TEMPERATURE: 370, PROCESSING TIME ······ PRESSURE: 15, GAS FLOW RATE ······ |
| ⋮ | ⋮ | ⋮ |

FIG. 9

| S4 | SR02 | SRS005 | 255 | 2005/12/02 16:55:07 |
|---|---|---|---|---|
| STEP IDENTIFIER | SUB-RECIPE IDENTIFIER | SUB-RECIPE STEP IDENTIFIER | GAS FLOW RATE (VALUE) | TIME INFORMATION |

FIG. 10

| MANUFACTURING APPARATUS IDENTIFIER | RECIPE IDENTIFIER | STEP IDENTIFIER | SUB-RECIPE IDENTIFIER | SUB-RECIPE STEP IDENTIFIER | VALUE (GAS FLOW RATE) | TIME INFORMATION |
|---|---|---|---|---|---|---|
| E1 | R1 | S1 | – | – | 230 | 2005/12/02 15:00:00 |
| | | S1 | – | – | 232 | 2005/12/02 15:00:01 |
| | | S1 | – | – | 235 | 2005/12/02 15:00:02 |
| | | ... | ... | ... | ... | ... |
| | | S2 | SR02 | SRS004 | 255 | 2005/12/02 16:21:58 |
| | | S2 | SR02 | SRS004 | 255 | 2005/12/02 16:21:59 |
| | | S2 | SR02 | SRS004 | 256 | 2005/12/02 16:22:00 |
| | | ... | ... | ... | ... | ... |
| | | S3 | – | – | 248 | 2005/12/02 16:45:12 |
| | | S3 | – | – | 248 | 2005/12/02 16:45:13 |
| | | ... | ... | ... | ... | ... |
| | | S4 | SR02 | SRS005 | 255 | 2005/12/02 16:55:07 |
| | | S4 | SR02 | SRS005 | 255 | 2005/12/02 16:55:08 |
| | | ... | ... | ... | ... | ... |
| | | S5 | SR02 | SRS004 | 256 | 2005/12/02 17:03:12 |
| | | S5 | SR02 | SRS004 | 256 | 2005/12/02 17:03:13 |
| | | ... | ... | ... | ... | ... |
| E1 | R2 | S1 | – | – | 261 | 2005/12/03 14:00:00 |
| | | S1 | – | – | 261 | 2005/12/03 14:00:01 |
| | | ... | ... | ... | ... | ... |
| E2 | R3 | S1 | – | – | 254 | 2005/12/04 10:00:30 |
| | | S1 | – | – | 241 | 2005/12/04 10:00:31 |
| ... | | | | | | |

FIG. 11

| MANUFACTURING APPARATUS IDENTIFIER | RECIPE IDENTIFIER | STEP IDENTIFIER | SUB-RECIPE IDENTIFIER | SUB-RECIPE STEP IDENTIFIER | MEAN VALUE (GAS FLOW RATE) | TIME INFORMATION |
|---|---|---|---|---|---|---|
| E1 | R1 | S1 | - | - | 230 | 2005/12/02 15:00:00 |
|  |  | S1 | - | - | 232 | 2005/12/02 15:00:10 |
|  |  | ... | ... | ... | ... | ... |
|  |  | S1 | - | - | 250 | 2005/12/02 16:19:50 |
|  |  | S2 | SR01 | SRS004 | 251 | 2005/12/02 16:20:00 |
|  |  | S2 | SR01 | SRS004 | 251 | 2005/12/02 16:20:10 |
|  |  | ... | ... | ... | ... | ... |
|  |  | S2 | SR01 | SRS004 | 256 | 2005/12/02 16:24:40 |
|  |  | S2 | SR01 | SRS004 | 255 | 2005/12/02 16:24:50 |
|  |  | S3 | - | - | 255 | 2005/12/02 16:25:00 |
|  |  | S3 | - | - | 254 | 2005/12/02 16:25:10 |
|  |  | ... | ... | ... | ... | ... |
|  |  | S3 | - | - | 250 | 2005/12/02 16:54:50 |
|  |  | S4 | SR01 | SRS004 | 251 | 2005/12/02 16:55:00 |
|  |  | ... | ... | ... | ... | ... |
|  |  | S4 | SR01 | SRS005 | 255 | 2005/12/02 16:59:40 |
|  |  | S4 | SR01 | SRS005 | 255 | 2005/12/02 16:59:50 |
|  |  | S5 | SR01 | SRS004 | 256 | 2005/12/02 17:00:00 |
|  |  | S5 | SR01 | SRS004 | 256 | 2005/12/02 17:00:10 |
|  |  | ... | ... | ... | ... | ... |
|  |  | S5 | SR01 | SRS005 | 255 | 2005/12/02 17:04:50 |
|  |  | S6 | - | - | 255 | 2005/12/02 17:05:00 |
|  |  | ... | ... | ... | ... | ... |
| E1 | R2 | S1 | - | - | 261 | 2005/12/03 14:00:20 |
|  |  | ... | ... | ... | ... | ... |
| E2 | R3 | S1 | - | - | 254 | 2005/12/04 10:00:40 |
|  |  | ... | ... | ... | ... | ... |
| ... | ... |  |  |  |  |  |

FIG. 13

| MANUFACTURING APPARATUS IDENTIFIER | RECIPE IDENTIFIER | NUMBER OF TIMES OF EXECUTION | STEP IDENTIFIER | SUB-RECIPE IDENTIFIER | SUB-RECIPE STEP IDENTIFIER | MEAN VALUE (GAS FLOW RATE) | TIME INFORMATION |
|---|---|---|---|---|---|---|---|
| E1 | R1 | 1 | S2 | SR02 | SRS004 | 251 | 2005/12/02 16:20:00 |
| | | | S2 | SR02 | SRS004 | 251 | 2005/12/02 16:20:10 |
| | | | ... | ... | ... | ... | ... |
| | | | S2 | SR02 | SRS004 | 256 | 2005/12/02 16:24:40 |
| | | | S2 | SR02 | SRS004 | 255 | 2005/12/02 16:24:50 |
| | | 3 | S5 | SR02 | SRS004 | 256 | 2005/12/02 17:00:00 |
| | | | S5 | SR02 | SRS004 | 256 | 2005/12/02 17:00:10 |
| | | | ... | ... | ... | ... | ... |
| | | | S5 | SR02 | SRS004 | 254 | 2005/12/02 17:04:40 |
| | | | S5 | SR02 | SRS005 | 255 | 2005/12/02 17:04:50 |

SERVER DEVICE AND PROGRAM WITH SUB-RECIPE MEASUREMENT COMMUNICATION

TECHNICAL FIELD

The present invention relates to a server device in a group management system including, for example, one or more manufacturing apparatuses for performing a preset process on a target substrate, and the server device connected with the one or more manufacturing apparatuses.

BACKGROUND ART

Conventionally, there has been known a measurement data processing method capable of automatically and correctly processing data transmitted from a measuring device in a group management system of semiconductor manufacturing apparatuses (see, for example, Patent Document 1). In this measurement data processing method, a measuring device communication unit of a group managing unit of the group management system receives various kinds of measurement data transmitted from the measuring device. This measurement data processing method includes the steps of registering formulas for processing the measurement data in advance; upon receiving the measurement data; storing the received measurement data in a measurement data receiving buffer; selecting, among the registered formulas, one formula suitable for processing the measurement data and having at least one same recipe name based on a recipe name contained in the measurement data and storing the selected formula in a formula storing buffer; applying the stored measurement data to the selected formula and performing a calculation thereof; and storing a calculation result in a processed data storing buffer.

Further, the conventional group management system of semiconductor manufacturing apparatuses has a function of displaying time sequential information (hereinafter, referred to as a chart) measured by the semiconductor manufacturing apparatuses.

Further, as a manufacturing apparatus composing the group management system, there is a so-called batch type vertical heat treatment apparatus (see, Patent Document 2 and Patent Document 3).

Typically, in the semiconductor manufacturing apparatus, a manufacturing process is performed according to information indicating a process condition or a process sequence including a manufacturing parameter, which is called a recipe, or the like. Each step composing a sequence of the recipe is called a recipe step or simply called a step. The fault of the semiconductor manufacturing apparatus can be determined, when the step is changed, by whether or not a control is performed according to a parameter of the changed step. Therefore, it is possible to recognize the fault of the semiconductor manufacturing apparatus by acquiring all measurement information obtained from the measuring device and then monitoring them, within a time period for performing the step.

In the above-stated semiconductor manufacturing apparatus, as one or more steps constituting the recipe, there has often been used information indicating a process sequence composed of a plurality of steps like the recipe, and this information is called a sub-recipe. That is, the recipe uses the sub-recipe, whereby the recipe has a nest structure in which the recipe is included in the recipe by using the sub-recipe. By using the sub-recipe in two or more steps constituting the recipe, it is possible to repeatedly perform, within one recipe, a process composed of a plurality of steps in the sub-recipe. By using the sub-recipe, if a parameter or the like of the sub-recipe is modified, all the parameters of the step having the sub-recipe can be eventually modified so that it becomes easy to set up the recipe.

Patent Document 1: Japanese Patent Laid-open Publication No. H11-354395 (for example, Page 1 and FIG. 1)
Patent Document 2: Japanese Patent Publication No. 3543996 (for example, Page 1 and FIG. 1)
Patent Document 3: Japanese Patent Laid-open Publication No. 2002-25997 (for example, Page 1 and FIG. 1)

DISCLOSURE OF THE INVENTION

Problems to be Solved by the Invention

However, in a conventional server device, there has been a problem that measurement values measured when a sub-recipe is executed in a manufacturing apparatus can not be acquired appropriately.

That is, in the conventional server device, if a recipe includes a plurality of the same sub-recipes, when trying to acquire and output information including measurement values of the sub-recipes, it is impossible to acquire measurement values excepting measurement values acquired when the sub-recipe is initially executed. For this reason, among measurement values obtained as result of performing the same sub-recipes, a measurement value of the sub-recipe executed at, e.g. a second time can not be acquired. Accordingly, it is impossible to easily acquire a measurement value of a desired sub-recipe so that the manufacturing apparatus can not be monitored appropriately by using measurement values.

Means for Solving the Problems

A server device in accordance with the present invention is directed to a server device constituting a group management system, which includes one or more manufacturing apparatuses for performing a preset process on a target substrate and the server device connected with the one or more manufacturing apparatuses and has a function of performing a fault detection, the server device including: a measurement information storage unit for storing therein plural measurement information, which is time sequential information measured in the one or more manufacturing apparatuses and has a measurement value obtained by executing a predetermined recipe by the manufacturing apparatuses and time information indicating time; an instruction receiving unit for receiving an output instruction of the measurement information; a measurement information acquisition unit for acquiring, from the measurement information storage unit, measurement information designated by the output instruction; an output information composing unit for composing output information by using the acquired measurement information; and an output unit for outputting the output information composed by the output information composing unit, wherein the recipe includes one or more sub-recipes, the output instruction received by the instruction receiving unit includes an instruction for designating one or more desired number of times of execution of a sub-recipe among plural number of times of execution of the sub-recipe in the recipe, and the measurement information acquisition unit acquires measurement information corresponding to the sub-recipe designated by the output instruction.

With this configuration, it is possible to selectively output the measurement information corresponding to a desired sub-recipe by designating the sub-recipe and the number of times of processing (the number of times of execution) of the sub-recipe. Accordingly, for example, by selectively outputting information necessary for monitoring, a monitoring period can be set. Therefore, it is possible to efficiently perform a monitoring procedure. To be specific, if there is a sub-recipe to be iterated (looped) and executed in a recipe, a monitoring target can be limited to a measurement value obtained from a sub-recipe executed initially, for example. Further, by limiting a period for performing a fault detection, the fault detection can be executed appropriately without having to perform the fault detection during an unnecessary period.

Further, in the server device of the present invention, the measurement information acquisition unit counts the number of times of new appearances of a measurement information group corresponding to the sub-recipe which is designated by the output instruction and executed plural times with respect to the measurement information stored in the measurement information storage unit, and acquires one or more measurement information included in the measurement information group when the counted number is identical with the desired number of times designated by the output instruction.

With this configuration, it is possible to selectively output measurement information corresponding to a desired sub-recipe.

Further, in the server device of the present invention, the sub-recipe includes two or more steps, and when two or more measurement information corresponding to two or more steps constituting the sub-recipe appears repeatedly, the measurement information acquisition unit makes the repeatedly appeared one or more measurement information into the measurement information group corresponding to the sub-recipe executed plural number of times.

With this configuration, it is possible to selectively output the measurement information acquired at a desired number of times of execution among the measurement information corresponding to the repeatedly executed sub-recipe by appropriately counting the number of times of execution of the sub-recipe.

Furthermore, in the server device of the present invention, the measurement information includes a sub-recipe identifier for identifying a sub-recipe corresponding to the measurement information, and the measurement information corresponding to the sub-recipe executed plural number of times includes the same sub-recipe identifier, and the measurement information acquisition unit counts the number of times of new detections of the sub-recipe identifier of the sub-recipe which is designated by the output instruction and executed plural number of times with respect to the measurement information stored in the measurement information storage unit, and acquires one or more measurement information containing the sub-recipe identifier when the counted number is identical with the desired number of times designated by the output instruction.

With this configuration, it is possible to selectively output measurement information corresponding to a desired sub-recipe.

Further, in the server device of the present invention, the sub-recipe includes two or more steps, and the measurement information corresponding to the sub-recipe includes step identifiers for identifying the steps, and the measurement information acquisition unit makes a count-up operation whenever two or more step identifiers repeatedly appear in consecutive measurement information having the same sub-recipe identifier.

With this configuration, it is possible to selectively output the measurement information acquired at a desired number of times of execution among the measurement information corresponding to the repeatedly executed sub-recipe by appropriately counting the number of times of execution of the sub-recipe.

Furthermore, in the server device of the present invention, the instruction receiving unit receives the output instruction for designating two or more desired number of times of execution of the sub-recipe among the plural number of times of execution of the sub-recipe in the recipe, and the measurement information acquisition unit acquires measurement information corresponding to the sub-recipe executed at two or more different times, and the output information composition unit composes the output information resulted from a predetermined calculation performed on the measurement information having the same time elapsed from a predetermined start point in each sub-recipe among the measurement information corresponding to the sub-recipe executed at the two or more different times acquired by the measurement information acquisition unit.

With this configuration, it is possible to process and output measurement information of the sub-recipe acquired at different number of times of execution according to the purpose so that monitoring becomes easy, and the measurement information can be flexibly used for various purposes.

Further, in the server device of the present invention, the output information composing unit composes an SPC chart which is a chart plotting the acquired measurement information according to a time sequence indicated by the time information contained in the measurement information, and the output unit outputs the SPC chart composed by the output information composing unit.

With this configuration, it is possible to easily monitor the change in the process of time or a non-uniformity of the manufacturing apparatus.

Further, in the server device of the present invention, the output information composing unit composes a correlation chart which is a chart showing a correlation between two kinds of measurement information from the acquired measurement information, and the output unit outputs the correlation chart composed by the output information composing unit.

With this configuration, a correlation between two variables can be monitored, so that it is possible to efficiently detect the fault.

Further, in the server device of the present invention, the output information composing unit composes a MD (Mahalanobis Distance) chart which is a chart showing a correlation among three or more kinds of measurement information from the acquired measurement information, and the output unit outputs the MD chart composed by the output information composing unit.

With this configuration, a correlation among multi-variables can be monitored, so that it is possible to detect the fault more efficiently.

Effect Of The Invention

With a server device in accordance with the present invention, it is possible to selectively output measurement information corresponding to a desired sub-recipe.

BRIEF DESCRIPTION OF THE DRAWINGS

FIG. 3 is a block diagram of the group management system in accordance with the embodiment of the present invention;

FIG. 7 is a diagram of showing a recipe management table of the group management system in accordance with the embodiment of the present invention;

FIG. 8 offers a view of illustrating a sub-recipe management table of the group management system in accordance with the embodiment of the present invention;

FIG. 9 is a view of showing an example of raw information of the group management system in accordance with the embodiment of the present invention;

FIG. 10 is a diagram of showing a raw information management table of the group management system in accordance with the embodiment of the present invention;

FIG. 11 is a view of showing a measurement information management table of the group management system in accordance with the embodiment of the present invention;

FIG. 13 shows a diagram of illustrating an acquired information management table of the group management system in accordance with the embodiment of the present invention;

BEST MODE FOR CARRYING OUT THE INVENTION

Figure 1:
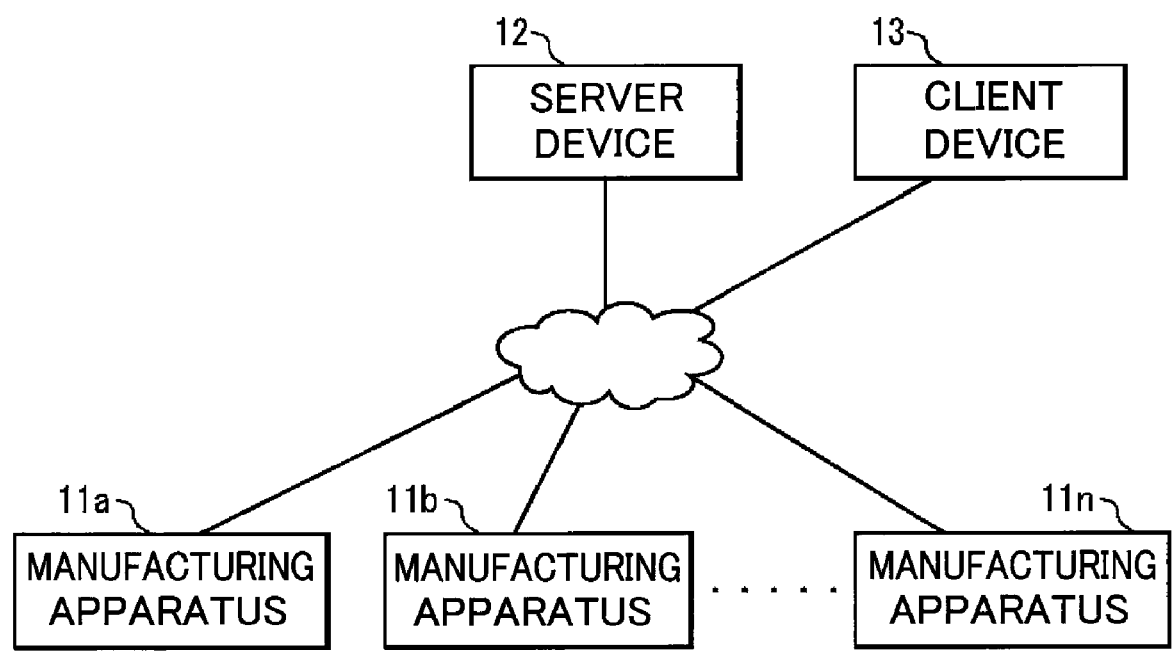
FIG. 1 is a conceptual diagram of a group management system in accordance with an embodiment of the present invention.

Hereinafter, a server device and so forth in accordance with embodiments of the present invention will be described in detail with reference to the accompanying drawings. In the embodiments, elements assigned like reference numerals are operated in the same way, so that redundant description thereof may be omitted.

Embodiment

FIG. 1 is a conceptual diagram of a group management system in accordance with an embodiment of the present invention. The group management system is a system for managing manufacturing apparatuses such as a semiconductor manufacturing apparatus, a liquid crystal panel manufacturing apparatus or the like. Further, the group management system includes one or more manufacturing apparatuses 11 (from a manufacturing apparatus 11a to a manufacturing apparatus 11n (here, n represents a random number)), a server device 12 and a client device 13.

Figure 2:
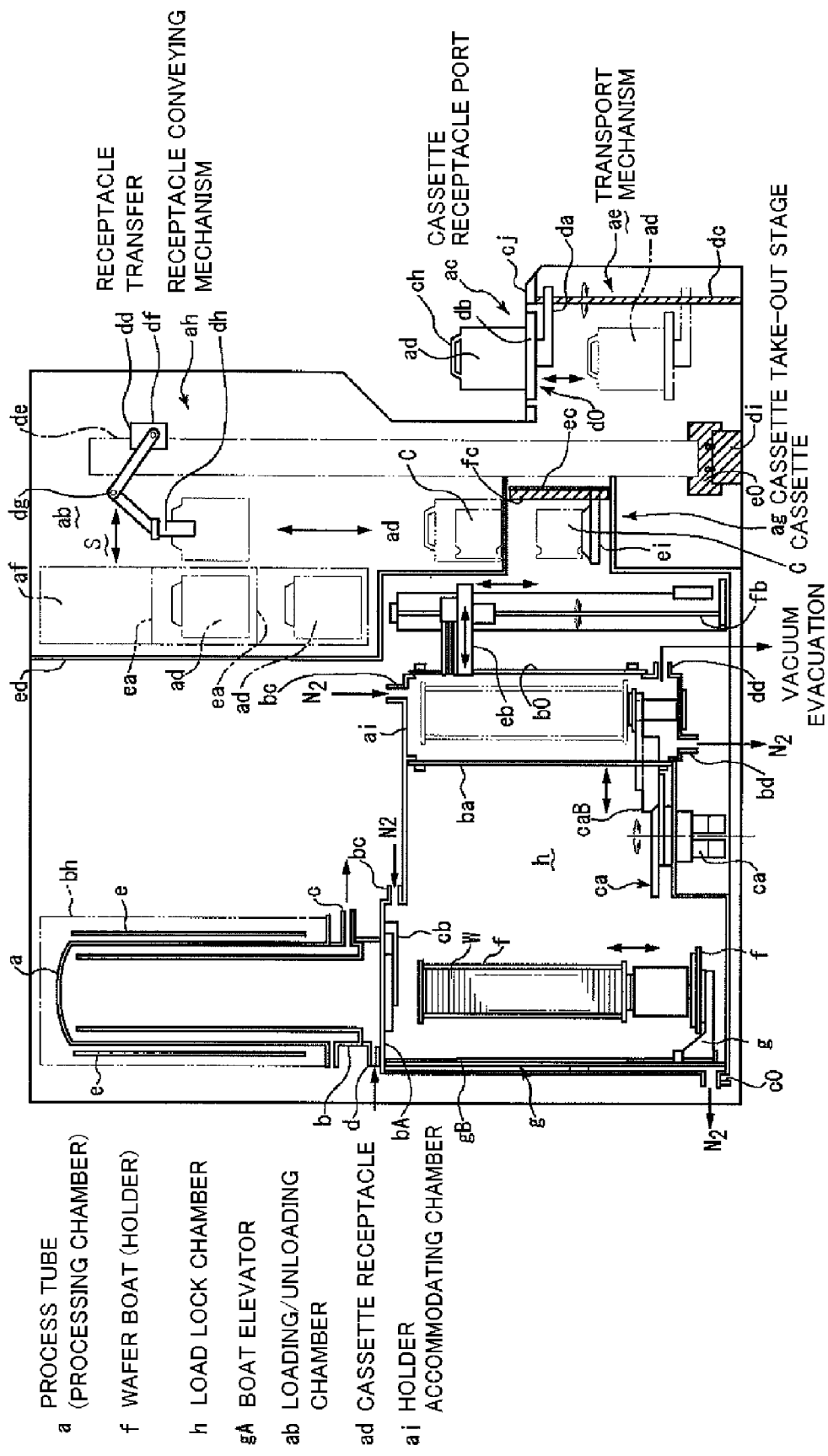
FIG. 2 is a view of showing an example of a semiconductor manufacturing apparatus of the group management system in accordance with the embodiment of the present invention.

The manufacturing apparatus 11 is an apparatus for performing a preset process on a target substrate, e.g., a semiconductor wafer and the like. The manufacturing apparatus 11 performs various processes such as a film forming process, an etching process, a thermal oxidation process, and the like on the target substrate. The manufacturing apparatus 11 is, for example, a batch type vertical heat treatment apparatus disclosed in the above-stated Patent Document 2 or Patent Document 3. An example of the manufacturing apparatus 11 is illustrated in FIG. 2. The manufacturing apparatus 11 is an apparatus having, as a loading chamber, a so-called load lock chamber structure capable of being airtightly sealed against other chambers while allowing a supply or a vacuum exhaust of an $N_2$ gas as a nonreactive atmosphere. The manufacturing apparatus 11 includes, as major components, a process tube a serving as a processing chamber for performing a preset process on a wafer W which is a target object to be processed; a load lock chamber h serving as a loading chamber having a transfer mechanism g for loading or unloading a wafer boat f into or from the process tube a, wherein the wafer boat f serves as a holder for accommodating therein a number of, for example, 100 sheets of wafer W; a loading/unloading chamber ab for loading or unloading the wafer W into or from the load lock chamber h; a cassette receptacle port ac formed inside the loading/unloading chamber ab; a transport mechanism ae for transporting a cassette receptacle ad loaded on the port ac into the loading/unloading chamber ab; a receptacle storage stage af for temporarily storing therein the transported cassette receptacle ad; a cassette take-out stage ag for taking out a cassette C accommodated in the cassette receptacle ad; a receptacle conveying mechanism ah for performing a conveyance of the cassette receptacle ad accommodated within the loading/unloading chamber ab; and a holder accommodating chamber ai disposed between the load lock chamber h and the loading/unloading chamber ab, for accommodating the wafer boat f therein. Further, since other components of the example manufacturing apparatus 11 in FIG. 2 and their operations are already known (see Patent Document 2), their detailed description will be omitted. Furthermore, a chamber as shown in FIG. 1 of Patent Document 3 is desirable as a chamber for constituting the manufacturing apparatus 11.

Further, the manufacturing apparatus 11 stores therein, for example, a recipe which is information upon a specific process for the wafer, and the manufacturing apparatus 11 is controlled by using the recipe.

Further, the server device 12 constitutes a so-called group management system, and it stores therein various measurement information obtained from the one or more manufacturing apparatuses 11 and has a function of performing a fault detection on the measurement information.

Further, the client device 13 sends various requests to the server device 12, and receives processed results from the server device 12.

FIG. 3 is a block diagram of the group management system in accordance with the embodiment of the present invention.

The manufacturing apparatus 11 includes an input receiving unit 1101, a recipe storage unit 1102, a manufacturing apparatus identifier storage unit 1103, a time measuring unit 1104, a processing unit 1105, a measuring unit 1106, a raw information accumulation unit 1107, and a raw information transmitting unit 1108.

The server device 12 includes a measurement information storage unit 1201, a raw information receiving unit 1202, a measurement information acquisition unit 1203, a measurement information accumulation unit 1204, an instruction receiving unit 1205, an output information composing unit 1206, an output unit 1207, an output instruction accumulation unit 1208, a condition information storage unit 1209, and a fault detection unit 1210.

The client device 13 includes an instruction input unit 1301, an instruction transmitting unit 1302, a receiving unit 1303, and a display unit 1304.

The input receiving unit 1101 receives various inputs from a user of the manufacturing apparatus 11. The inputs can be a recipe, a recipe identifier for identifying the recipe, or a process execution instruction such as a wafer processing instruction and the like. An input unit for receiving various inputs from the user can be any of various types, such as a ten key, a keyboard, a mouse, a menu screen and the like. The input receiving unit 1101 can be implemented by a device driver of the input unit such as a ten key or a keyboard, or menu screen control software.

The recipe storage unit 1102 stores therein the recipe for use in controlling the manufacturing apparatus 11. The recipe is information on a preset process performed by the manufacturing apparatus 11 and information specifying a process condition including, e.g., a manufacture parameter and the like. Further, the recipe typically includes a single or a plurality of sequences constituting a process or information on setting process parameters for such sequences. Each of the sequences constituting the recipe is commonly called a recipe step or a step. The step typically includes a partial sequence of the process or information on setting a process parameter for such a sequence. Here, as one or more steps constituting the recipe, there is often used information including one or more, typically, two or more steps like the recipe and that information is called a sub-recipe. That is, the recipe uses the sub-recipe, whereby the recipe has a nest structure in which the recipe is included in the recipe. The process parameter information includes, e.g., a category name, an item name, a parameter name and a value. The category name indicates the kind of a process parameter, and it can be, for example, [temperature], [gas flow rate], [speed of boat elevator] or the like. The item name indicates the property of the process parameter, and it can be, for example, [speed of vertical movement], [speed of rotation] or the like. The parameter name indicates the name of the process parameter, and it can be, for example, [C], , [A] or the like. The value indicates a value assigned to a variable called the process parameter. Typically, the recipe is stored in a pair with a recipe identifier (e.g., recipe name) for identifying the recipe. Further, the recipe is stored in the recipe storage unit 1102 together with a step identifier which is an identifier of the step constituting the recipe and a sub-recipe identifier for identifying the sub-recipe. The step identifier can be, for example, a name of the step, an identification number thereof, or the like. The sub-recipe identifier can be a name of the sub-recipe, identification number thereof, or the like. Though the steps constituting the sub-recipe are the same as those constituting the recipe and may have the same step identifiers as the steps constituting the recipe, the step constituting the sub-recipe is called a sub-recipe step for the sake of convenience of explanation and the identifier thereof is called a sub-recipe step identifier herein. Though the recipe storage unit 1102 is desirably a non-volatile storage medium, it can also be implemented by a volatile storage medium.

The manufacturing apparatus identifier storage unit 1103 stores therein a manufacturing apparatus identifier for identifying the manufacturing apparatus 11. The manufacturing apparatus identifier may be information which can identify each of the manufacturing apparatuses 11, for example, an apparatus name, a type number, a manufacture number, an identification number or a name designated for each of the manufacturing apparatuses 11, or the like. The manufacturing apparatus identifier may be information received by the input receiving unit 1101 or information previously stored in the manufacturing apparatus. Though the manufacturing apparatus identifier storage unit 1103 is desirably a non-volatile storage medium such as a hard disk, a ROM or the like, but it can also be a volatile storage medium such as a RAM or the like.

The time measuring unit 1104 measures time. The time measuring unit 1104 outputs time information, which is acquired as a result of measuring time, to the measurement unit 1106. Here, the time information may include information of year, month and date. The time measured by the time measuring unit 1104 may be an absolute time or a relative time. The time measuring unit 1104 is realized by, e.g., a clock or the like.

The processing unit 1105 reads a recipe of the recipe storage unit 1102 and performs a preset process on a target substrate according to the recipe. Typically, the processing unit 1105 can be realized by an MPU, a memory or the like. The process sequence of the processing unit 1105 is typically realized by software, which is stored in a storage medium such as a ROM. However, it is also possible to realize the process sequence by using hardware (a dedicated circuit).

The measuring unit 1106 measures the temperature, the gas flow rate or the pressure within the manufacturing apparatus 11 or the power of the manufacturing apparatus 11, and obtains raw information which becomes a basis of measurement information to be charted. The raw information is information such as a measurement temperature or the like. The measuring unit 1106 performs the measurement, e.g., at a regular or irregular predetermined time interval. The raw information includes measurement values which are obtained by measurement. Further, the raw information typically includes time information indicating measurement time. The time information is obtained from, e.g., the time measuring unit 1104. It is desirable that the raw information includes: a step identifier for identifying a step executed when the measuring unit 1106 measures the temperature or the like; measurement values which are the measured values; and time information indicating the measurement times. Further, if the sub-recipe is being executed as a step under execution during measurement, the raw information includes a sub-recipe identifier for identifying the sub-recipe under execution. Furthermore, it is desirable that the raw information includes a sub-recipe step identifier for identifying a sub-recipe step under execution within a sub-recipe under execution. Furthermore, the recipe identifier, the step identifier, the sub-recipe identifier, the sub-recipe step identifier or the like is acquired from, e.g., the recipe storage unit 1102. It may be possible that the raw information includes a recipe identifier for the recipe under execution. Further, it may be possible that the raw information includes a manufacturing apparatus identifier of the manufacturing apparatus 11 performing a recipe. This manufacturing apparatus identifier is obtained from, e.g., the manufacturing apparatus identifier storage unit 1103. Further, the raw information may include information for identifying a measurement object such as the temperature or the gas pressure, and a measurement location such as the inside of the processing tube, which are measured by the measuring unit 1106. For example, the information may be a name of the measurement object and a name of the measurement location or may be identification information corresponding thereto. It is possible for the measuring unit 1106 to measure plural values such as the temperature and the gas flow rate, or temperatures at plural locations. That is, it is possible that the raw information includes more than one kind of measurement values. The measuring unit 1106 can be realized by sensors such as one or more temperature sensors or one or more flow rate sensors.

The raw information accumulation unit 1107 accumulates the raw information obtained by the measuring unit 1106 in a non-illustrated storage medium. Typically, the raw information accumulation unit 1107 can be implemented by, e.g., an MPU and a memory. Typically, the process sequence of the raw information accumulation unit 1107 is realized by software, which is stored in a storage medium such as a ROM. However, it is also possible to realize the process sequence by using hardware (a dedicated circuit). Furthermore, though the non-illustrated storage medium is desirably a non-volatile storage medium, it can also be implemented by a volatile storage medium.

The raw information transmitting unit 1108 transmits the raw information accumulated by the raw information accumulation unit 1107 to the server device 12. Here, there is no specific limitation in implementing a trigger for the transmission of the raw information. Further, the raw information transmitted by the raw information transmitting unit 1108 includes one or more kinds (e.g., temperature and gas flow rate) of measured values, that is, measurement values and time information. Further, in case the raw information transmitted by the raw information transmitting unit 1108 includes measurement values measured while executing the sub-recipe, it includes a sub-recipe identifier of the sub-recipe under execution during the measurement. Further, in this case, it is desirable that the raw information transmitted by the raw information transmitting unit 1108 includes a sub-recipe step identifier. Further, it s desirable that the raw information transmitted by the raw information transmitting unit 1108 includes a step identifier. Furthermore, it is desirable that the raw information transmitted by the raw information transmitting unit 1108 includes a manufacturing apparatus identifier for identifying the manufacturing apparatus 11 or a recipe identifier for identifying a recipe. Further, the raw information may include information for identifying a measurement target such as the temperature or the gas pressure, or a measurement location such as the inside of the processing tube, which is measured by the measuring unit 1106. Besides, it is possible that the raw information accumulated by the raw information accumulation unit 1107 has a different structure or component from that of the raw information transmitted by the raw information transmitting unit 1108. Further, the raw information may include at least one of a single manufacturing apparatus identifier, a single recipe identifier and a single step identifier for plural measurement values. The raw information transmitting unit 1108 can be realized by a wired or wireless communication means or the like. Furthermore, it may be also possible that the raw information transmitting unit 1108 reads the sub-recipe identifier, the sub-recipe step identifier, the step identifier, the recipe identifier or the manufacturing apparatus identifier from the recipe storage unit 1102 or the manufacturing apparatus identifier storage unit 1103, respectively, and adds it to the raw information prior to transmitting the raw information to the server device 12.

Further, it may be possible for the raw information transmitting unit 1108 to transmit the raw information whenever a value (e.g., gas flow rate) is measured, or to simultaneously transmit raw information (e.g., raw information including 10 measurement values) in which a preset number of measurement values is collected. There is no specific limitation in a unit or structure of the data transmitted by the raw information transmitting unit 1108. Furthermore, the process of composing the raw information to be transmitted can be carried out by the raw information accumulation unit 1107 instead of the raw information transmitting unit 1108. There is no specific limitation in transmission timing of the measured raw information, the manufacturing apparatus identifier, the recipe identifier or the recipe step identifier.

The measurement information storage unit 1201 can store therein a plurality of measurement information. The plurality of measurement information are time sequential information containing one or more kinds of information (e.g., the temperature or the pressure) measured in the one or more manufacturing apparatuses 11, and are information containing time information indicating time and measurement values when a preset process is performed in the manufacturing apparatus. Further, in case the measurement information includes the measurement values measured while executing the sub-recipe, it includes a sub-recipe identifier. Further, in this case, it is desirable that the raw information transmitted by the raw information transmitting unit 1108 includes a sub-recipe step identifier. Further, the plurality of measurement information may include a manufacturing apparatus identifier for identifying the manufacturing apparatus 11, a recipe identifier, a step identifier or the like. The measurement information may be information acquired by performing a preset calculation on a plurality of raw information, which is received by the raw information receiving unit 1202, by the measurement information acquisition unit 1203 or it may be the same information as the raw information. Though the measurement information storage unit 1201 is desirably a non-volatile storage medium, but it can also be implemented by a volatile storage medium. Further, the measurement information of the measurement information storage unit 1201 may be information accumulated by the measurement information accumulation unit 1204, information directly received from the manufacturing apparatuses 11 or information read from a non-illustrated storage medium.

The raw information receiving unit 1202 receives, from the plural manufacturing apparatuses 11, the raw information which is a basis of the plurality of measurement information. The raw information receiving unit 1202 can be implemented by a wireless or wired communication means or the like.

The measurement information accumulation unit 1204 accumulates, in the measurement information storage unit 1201, measurement information according to the plurality of raw information received by the raw information receiving unit 1202. The measurement information may be information acquired by performing a preset calculation on the plurality of raw information, which are received by the raw information receiving unit 1202, by the measurement information acquisition unit 1203 or it may be the same information as the raw information. Here, the preset calculation refers to a calculation performed at a preset time interval to acquire, for example, a mean value, a maximum value, a minimum value, a normalized value, a standard deviation or a median value of a multiplicity of values of the plurality of raw information. Further, in case that the plurality of measurement information acquired by the measurement information acquisition unit 1203 is stored in the measurement information storage unit 1201, the accumulation process performed by the measurement information accumulation unit 1204 becomes to have the same meaning as an NOP (No Operation). Typically, the measurement information accumulation unit 1204 can be implemented by an MPU and a memory, or the like. Typically, the process sequence of the measurement information accumulation unit 1204 is implemented by software, which is stored in a storage medium such as a ROM or the like. Here, hardware (a dedicated circuit) may be also possible for the implementation.

The instruction receiving unit 1205 receives instructions. Though the instructions are typically received from the client device 13, they can also be received from a keyboard, a mouse or the like connected with the server device 12. The instruction received by the instruction receiving unit 1205 is, e.g., an output instruction of the measurement information stored in the measurement information storage unit 1201. The output instruction is, e.g., an output instruction of measurement information corresponding to a desired step among the steps constituting the recipe. Further, the output instruction includes, for example, an instruction for designating a sub-recipe executed at one or more desired number of times among the sub-recipes executed plural number of times in the recipe. [One or more desired number of times] can be one specific number of time such as a first time, a specific plural number of times such as both of second and fifth times, or all the number of times. It may be possible that the instruction for designating the sub-recipe is an instruction including a sub-recipe identifier corresponding to the designated sub-recipe. The output instruction may include, e.g., a recipe identifier, which is information for designating a recipe in order to output the measurement information including the values measured, for example, while executing the desired recipe. The output instruction may further include information, e.g., a manufacturing apparatus identifier for designating at least one of the plural manufacturing apparatuses 11 in order to output the measurement information of a specific manufacturing apparatus among the plural manufacturing apparatuses 11. Furthermore, the output instruction may include information for designating how to output the measurement information. The output instruction may be, for example, an instruction to output the measurement information in a desired data type or an instruction to output the measurement information in a chart, or it may be an instruction to output a result of a specific analysis or process, e.g., a multivariate analysis or a statistical analysis, by using the measurement information. Further, it may be an instruction to perform a fault detection, a fault analysis or the like by using the measurement information. Further, the output instruction may include information on a kind of an output chart such as an SPC chart, a correlation chart, an MD chart or the like. Further, the output instruction may include information for designating a data type, e.g., the temperature, the gas flow rate, the pressure or the like, of the measurement information which is outputted in a chart. In addition, the output instruction may include information on the property of a dot or a line constituting the chart. The property information contains colors and types (shapes) of a dot, colors and types of a line, and the like. The instruction receiving unit 1205 is made up of, for example, a wireless or wired receiving means. An input means for inputting the instructions can be implemented in various ways, and, for example, it can be a ten key, a keyboard, a mouse, a menu screen or the like. The instruction receiving unit 1205 may be implemented by a device driver of the input means such as the ten key or the keyboard, or control software of the menu screen, or the like.

The measurement information acquisition unit 1203 acquires, from the measurement information storage unit 1201, the measurement information designated by an output instruction of the measurement information received by the instruction receiving unit 1205. To be specific, if the output instruction includes an instruction for designating one or more desired times of execution of a sub-recipe among plural times of execution of the sub-recipe, the measurement information acquisition unit 1203 acquires measurement information corresponding to the designated time of execution of the sub-recipe, e.g., measurement information measured while executing the sub-recipe, or measurement information which is resulted from a process of a preset calculation or the like performed on the above measurement information. The measurement information acquisition unit 1203 acquires measurement information at one or more designated number of times (e.g., at a first time only, at a fifth time only, or at both of first time and fourth time). To be specific, the measurement information acquisition unit 1203 acquires, from the measurement information storage unit 1201, the measurement information relating to an identifier which is identical with the step identifier or the sub-recipe identifier included in the output instruction. Further, if the output instruction includes an apparatus identifier, a recipe identifier or the like, the measurement information acquisition unit 1203 acquires measurement information whose identifier is identical with the apparatus identifier or the recipe identifier as well. The measurement information acquisition unit 1203 counts the number of times of a new appearance of a measurement information group corresponding to a sub-recipe, which is designated by the output instruction and executed plural number of times, i.e., a group of one or more measurement information acquired by using one or more measurement values measured while executing the sub-recipe one time. When the counted number of times becomes identical with a desired number of times designated by the output instruction, the measurement information acquisition unit 1203 acquires the one or more measurement information included in the appeared group of the measurement information. To be specific, it is assumed that the measurement information corresponding to the sub-recipe executed plural number of times has the same sub-recipe identifier. Then, if the sub-recipe identifier of the sub-recipe executed plural number of times and the output instruction for designating one or more number of times of execution of the sub-recipe are received, the measurement information acquisition unit 1203 counts the number of times of a new detection of the sub-recipe identifier of the sub-recipe which is designated by the output instruction and executed plural number of times with respect to the measurement information stored in the measurement information storage unit 1201 and then acquires the measurement information when the counted number is identical with the number of times included in the output instruction. To be more specific, the measurement information acquisition unit 1203 counts the number of times of a new detection of the measurement information corresponding to the sub-recipe identifier included in the output instruction with respect to the measurement information stored in the measurement information storage unit 1201 and when the counted number is identical with the number of times included in the output instruction, acquires the measurement information having the sub-recipe identifier designated by the output instruction. Further, if the measurement information having the same sub-recipe identifier appears or is detected continuously on a time axis, except a case where the same sub-recipe is repeatedly executed, it is not deemed to be a new appearance or a new detection of the measurement information but deemed to be a group of the measurement information. Further, it is presumed that a process of detecting the new appearance is based on a process of sorting the measurement information by using time information. As a result, counting the number of times of a new appearance or detection may be a process capable of counting the number of times of a new appearance or detection. For example, if the measurement information having the same sub-recipe identifier as one included in the output instruction is detected, the process is a process of counting up when a sub-recipe identifier contained in measurement information just prior to the measurement information on the time axis is not the same as one included in the output instruction. Further, when the sub-recipe includes two or more sub-recipe steps and the sub-recipe is deemed to be executed repeatedly and continuously, there is a likelihood that the measurement information is determined to be obtained from the sub-recipe executed once if simply counting the number of times of a new appearance of the sub-recipe identifier in accordance with the above-stated method since the measurement information corresponding to the sub-recipe executed plural times repeatedly is continuous on a time axis and has the same sub-recipe identifier. For this reason, when two or more measurement information corresponding to two or more sub-recipe steps constituting the sub-recipe appears repeatedly, the measurement information acquisition unit 1203 determines that the one or more measurement information appeared repeatedly is one of the groups of the measurement information corresponding to the sub-recipe executed plural times and then makes a count-up operation. To be specific, the measurement information acquisition unit 1203 makes the count-up operation whenever two or more sub-recipe step identifiers, i.e., the sub-recipe step identifiers of the two or more sub-recipe steps constituting the sub-recipe, repeatedly appear in the consecutive plural measurement information having the same sub-recipe identifier. In this way, even if the sub-recipe is repeatedly executed, it is possible to accurately count the number of times of execution of the sub-recipe. For example, repetitive execution of such a sub-recipe can be determined by whether or not regularity in detecting the sub-recipe step identifier is maintained, and there is no limitation in the regularity used for such a determination. Typically, the measurement information acquisition unit 1203 can be realized by an MPU, a memory or the like. The process sequence of the measurement information acquisition unit 1203 is typically realized by software, which is stored in a storage medium such as a ROM. However, it is also possible to realize the process sequence by using hardware (a dedicated circuit).

The output information composing unit 1206 composes output information by using the measurement information acquired by the measurement information acquisition unit 1203. Further, if the instruction receiving unit 1205 receives an output instruction for designating the sub-recipe executed at two or more desired number of times (e.g., at both of the first time and fifth time, and the like) among the sub-recipe executed plural times in the recipe and the measurement information acquisition unit 1203 acquires the measurement information corresponding to the sub-recipe executed at two or more different number of times according to the output instruction, it may be possible that the output information composing unit 1206 composes output information resulted from a predetermined calculation performed on the measurement information having the same time elapsed from a predetermined start point in each sub-recipe among the measurement information corresponding to the sub-recipe executed at the two or more different number of times and acquired by the measurement information acquisition unit 1203. The preset calculation refers to a calculation performed to acquire, for example, a mean value, a maximum value, a minimum value, a standard deviation or a difference between the maximum value and the minimum value. In this way, it is possible to output a chart or the like, for example, showing a result of the calculation of the mean value of the measurement values acquired when executing the sub-recipe at the other two or more number of times. For example, the output information composing unit 1206 composes the output information in a preset type or in a type indicated by the instruction received by the instruction receiving unit 1205, more particularly, in a text type, in an XML type, in a database type or the like. Further, the output information composing unit 1206 composes a chart as the output information by using the measurement information acquired by the measurement information acquisition unit 1203. Here, it is desirable that the output information composing unit 1206 composes the output information by visually distinguishing different kinds of the measurement information or the measurement information of different kinds of the manufacturing apparatuses. For example, the output information composing unit 1206 composes and outputs the output information according to the output instruction accumulated in the output instruction accumulation unit 1208. Further, it may be possible to perform a preset calculation by using the acquired measurement information and then compose the output information based on a result of the calculation. The preset calculation refers to a calculation performed at a preset time interval to acquire, for example, a mean value, an accumulated value along a time axis, a maximum value, a minimum value, a normalized value, a standard deviation or a median value of plural values of a plurality of measurement information. Further, the measurement information accumulation unit 1204 may perform such a preset calculation on a plurality of raw information when the plurality of raw information received by the raw information receiving unit 1202 are accumulated. Further, the output information composing unit 1206 may compose the output information by using a determination result of the fault detection unit 1210 to be described later. For example, the output information composing unit 1206 composes a chart from the plurality of the measurement information acquired by the measurement information acquisition unit 1203, but at this time, the output information composing unit 1206 composes the output information in which measurement information having a fault is visually distinguished from normal measurement information. Here, the output information may be, for example, list information containing a name of the measuring unit and time related to the measurement information having the fault. For example, the name of the measurement unit is acquired according to information for identifying a measurement location measured by the measurement unit 1106, which is included in the measurement information. In addition, the output information may be, for example, the list information or information of the chart made up of the measurement information. The output information is, for example, information notifying normality or fault. The output information is, e.g., sound information (a buzzer or the like) notifying either normality or fault. Further, the output information composing unit 1206 may perform a process of composing a chart showing ranges of abnormal values and normal values for fault detection. In such case, though the fault detection unit 1210 is supposed to read measurement information coincident with the output instruction, there is no restriction upon whether it performs a fault detecting process or not. When more than one manufacturing apparatus identifier is contained in the output instruction, the output information composing unit 1206 desirably composes a chart in which measurement information of the different manufacturing apparatus identifiers are visually distinguished from each other. Furthermore, when more than one recipe identifier is contained in the output instruction, the output information composing unit 1206 desirably composes a chart in which measurement information of the different recipe identifiers are visually distinguished from each other. Here, when the output instruction contains more than one manufacturing apparatus identifier, the chart allowing the visual distinction between the measurement information of the different manufacturing apparatus identifiers is a chart in which the measurement information of the different manufacturing apparatus identifiers is outputted in different types (shapes such as a rectangle and a circle, colors, and sizes) of dots, a chart in which the measurement information of the different manufacturing apparatus identifiers is connected by different colors of lines, or the like. Meanwhile, when the output instruction contains only one manufacturing apparatus identifier, the chart allowing the visual distinction between the measurement information of the different manufacturing apparatus identifiers implies a chart including a plurality of measurement information of that single manufacturing apparatus identifier. Furthermore, when the output instruction contains more than one recipe identifier, the chart allowing the visual distinction between the measurement information of the different recipe identifiers is a chart in which the measurement information of the different recipe identifiers is outputted in different types (shapes such as a rectangle and a circle, colors and sizes) of dots, a chart in which the measurement information of the different recipe identifiers is connected by different types of lines (a solid line, a dashed line, and so forth), or the like. Meanwhile, when the output instruction contains only one recipe identifier, the chart allowing the visual distinction between the measurement information of the different recipe identifiers implies a chart including a plurality of measurement information of that single recipe identifier. Moreover, the output information composing unit 1206 may compose, from the read plurality of measurement information, an SPC chart (statistical process management chart) which is a chart allowing a visual distinction of the measurement information of the different manufacturing apparatus identifiers and plotting the read plurality of measurement information according to a time sequence indicated by the time information contained in any one type of measurement information. The SPC chart is a chart used for a statistical process management and a chart for performing fault detection by monitoring the single variable. On the SPC chart, it is desirable that a maximum value and a minimum value (management values) of a target object to be monitored are preset, and when a monitored value falls beyond the range of such management values, the fault detection unit 1210 detects a fault and the detected fault is visually displayed. The maximum value is stored in, e.g., the condition information storage unit 1209 to be described later in advance. Furthermore, when the output instruction contains more than one manufacturing apparatus identifier, the output information composing unit 1206 may compose, from a plurality of measurement information having any one of the more than one manufacturing apparatus identifier, a correlation chart which is a chart capable of visually distinguishing the measurement information of the different manufacturing apparatus identifiers and showing a correlation between two kinds of measurement information. The correlation chart is a chart for monitoring a correlation between two variables, and a chart capable of detecting the fault from the two variables. Furthermore, when the output instruction contains more than one recipe identifier, the output information composing unit 1206 may compose an MD (Mahalanobis Distance) chart which is a chart capable of visually distinguishing the measurement information of the different recipe identifiers and showing a correlation between three or more kinds of measurement information. The chart composition is a process of acquiring a chart by, for example, connecting a plurality of measurement information by a line along a time axis. Since a method of composing a chart when a plurality of measurement information having values and time information is given is well-known, a detailed description thereof will be omitted. Further, since a method of composing an SPC chart, a correlation chart and an MD chart when a plurality of measurement information having values and time information is given is well-known, a detailed description thereof will be omitted. Here, the two kinds of measurement information also include information containing two kinds of measurement values (for example, the temperature and the gas flow rate) within single measurement information. Further, the three or more kinds of measurement information also include information containing three or more kinds of measurement values (for example, the temperature, the gas flow rate and the pressure) within single measurement information. Typically, the output information composing unit 1206 can be implemented by an MPU, a memory, or the like. The process sequence of the output information composing unit 1206 is typically realized by software, which is stored in a storage medium such as a ROM. However, it is also possible to use hardware (a dedicated circuit) for the realization.

The output unit 1207 outputs the output information such as the chart composed by the output information composing unit 1206. Here, the term "output" typically implies a transmission to the client device 13. However, the output unit 1207 can also display the chart on a display device connected with the server device 12, print it by a printer or transmit it to an external device. The output unit 1207 can be implemented by a wireless or wired communication means. However, it is also possible to implement the output unit 1207 by driver software of an output device, or driver software of the output device together with the output device, or the like.

The output instruction accumulation unit 1208 accumulates therein an output instruction having property information of a dot or a line and a manufacturing apparatus identifier, or property information of a dot or a line and a recipe identifier, or the like. For example, when the instruction receiving unit 1205 has received an accumulation instruction for accumulating a setup (including color information) of a chart, the output instruction accumulation unit 1208 may accumulate therein an output instruction having property information of a dot or a line and a manufacturing apparatus identifier or property information of a dot or a line and a recipe identifier. Furthermore, the output instruction accumulation unit 1208 can be typically implemented by an MPU, a memory, or the like. The process sequence of the output instruction accumulation unit 1208 is typically realized by software, which is stored in a storage medium such as a ROM. However, it is also possible to use hardware (a dedicated circuit) for the realization.

The condition information storage unit 1209 stores therein condition information on conditions for the fault detection. The condition information includes, for example, a maximum value and a minimum value defining a normal range of measurement values. The condition information may include, for example, only a boundary value between a normal value and an abnormal value. These values are typically called management values. Besides, the condition information may be varied depending on values to be measured (the temperature, the pressure, the gas flow rate, the power amount and so forth). In addition, there is no specific restriction in a structure of the condition information. Though the condition information storage unit 1209 is desirably a non-volatile storage medium, it can also be implemented by a volatile storage medium.

The fault detection unit 1210 determines whether the measurement values contained in the measurement information acquired by the measurement information acquisition unit 1203 are normal or abnormal. The fault detection unit 1210 determines whether the measurement values of the measurement information are normal or abnormal by using the condition information of the condition information storage unit 1209. To be specific, when the measurement information acquisition unit 1203 acquires the measurement information, the fault detection unit 1210 determines whether or not each of the measurement information satisfies the condition information. Typically, the fault detection unit 1210 can be implemented by an MPU, a memory, or the like. The process sequence of the fault detection unit 1210 is typically realized by software, which is stored in a storage medium such as a ROM. However, it is also possible to use hardware (a dedicated circuit) for the realization. Moreover, the fault detection process in the fault detection unit 1210 may be realized by a well-known fault detection process.

The instruction input unit 1301 inputs various instructions. The various instructions include, for example, the output instruction of the measurement information accumulated in the server device 12 as described above. Further, the various instructions include, for example, an instruction of startup, an instruction of chart output, an instruction of change of chart property values (type and color of lines, type and color of dots, and so forth), or the like. A means for inputting the instructions can be a ten key, a keyboard, a mouse, a menu screen or the like, though not limited thereto. The instruction input unit 1301 can be implemented by the input means such as the ten key, the keyboard or the like, a device driver thereof, control software of the menu screen, or the like.

The instruction transmitting unit 1302 transmits the instruction inputted by the instruction input unit 1301 to the server device 12. Here, the term "transmitting" typically means a transmission by a communication means. The instruction transmitting unit 1302 can be implemented by a wired or wireless communication means or the like.

The receiving unit 1303 receives the output information such as the chart from the server device 12. Here, the term "receiving" typically means reception by a communication means. The receiving unit 1303 can be implemented by a wired or wireless communication means or the like.

The display unit 1304 displays, on a display, the output information such as the chart or the like received by the receiving unit 1303. Further, if the receiving unit 1303 receives, from the server device 12, the output information in a text type, an XML type, a database type or the like, the display unit 1304 may be provided with an MPU or a memory for composing display data from the output information, so that the display unit 1304 may compose the display output information such as the chart or the like in the same way as the output information composing unit 1206, and display the output information on the display. The display unit 1304 may or may not include the display. It is possible to realize the display unit 1304 by driver software of the display, driver software of the display together with the display, or the like.

Hereinafter, an operation of the group management system will be explained. First of all, an operation of the manufacturing apparatus 11 will be explained with reference to a flowchart shown in FIG. 4. Further, there will be explained a case where the raw information includes: a step identifier corresponding to a step executed during the measurement; in case the step is a step of executing a sub-recipe, a sub-recipe identifier corresponding to the sub-recipe; and a sub-recipe step identifier corresponding to a sub-recipe step executed during the measurement among sub-recipe steps constituting the sub-recipe.

(Step S401) The processing unit 1105 reads a recipe from the recipe storage unit 1102.

(Step S402) The processing unit 1105 substitutes 1 for a counter i.

(Step S403) The processing unit 1105 determines whether or not $i^{th}$ step exists in the recipe read at step S401. If the $i^{th}$ step exists, the process proceeds to step S404; otherwise, the process proceeds to step S420.

(Step S404) The processing unit 1105 determines whether or not the $i^{th}$ step is a step of executing a sub-recipe. If the $i^{th}$ step is a step of executing the sub-recipe, the process proceeds to step S405; otherwise, the process proceeds to step S413.

(Step S405) The processing unit 1105 substitutes 1 for a counter h.

(Step S406) The processing unit 1105 determines whether or not $h^{th}$ sub-recipe step exists in a sub-recipe step of the sub-recipe determined to be executed in step S404. If the $h^{th}$ sub-recipe step exists, the process proceeds to step S407, and if $h^{th}$ step dose not exist, the process proceeds to step S418.

(Step S407) The processing unit 1105 performs a process of the $h^{th}$ sub-recipe step.

(Step S408) The measuring unit 1106 performs one or more kinds of predetermined measurement (e.g., the temperature and the pressure) and acquires measurement values (here, the measurement values only include one or more kinds of values, typically).

(Step S409) The measuring unit 1106 acquires time information from the time measuring unit 1104, and acquires a sub-recipe step identifier of the sub-recipe step currently executed, a step identifier corresponding to a step including the sub-recipe step and a sub-recipe identifier corresponding to a sub-recipe from the recipe storage unit 1102, and composes raw information by assigning the time information, the step identifier, the sub-recipe identifier and the sub-recipe step identifier to the measurement information.

(Step S410) The raw information accumulation unit 1107 accumulates the raw information obtained in step S409 in a non-illustrated memory temporarily.

(Step S411) The processing unit 1105 determines whether or not a process of the $h^{th}$ sub-recipe step is ended. For example, if a processing time of the $h^{th}$ sub-recipe step is predetermined, whether the processing time elapses is determined. Further, if an ending condition of the process of the $h^{th}$ sub-recipe step is determined, e.g., if it is predetermined that the process is supposed to end when the temperature reaches a specific temperature, determined is whether or not a processing condition is satisfied, and if satisfied, the process is determined to be ended. If the process is ended, the process proceeds to step S412; otherwise, the process returns to step S408.

(Step S412) The processing unit 1105 increments the counter h by 1 and the process returns to step S406.

(Step S413) The processing unit 1105 performs a process of the $i^{th}$ step.

(Step S414) The measuring unit 1106 performs the one or more kinds of the predetermined measurement (e.g., the temperature and the pressure) and acquires measurement values (here, the measurement values only include one or more kinds of values, typically).

(Step S415) The measuring unit 1106 acquires time information from the time measuring unit 1104 and a step identifier relating to the step under execution from the recipe storage unit 1102, and composes raw information by adding the time information and the step identifier to the measurement information.

(Step S416) The raw information accumulation unit 1107 temporarily stores the raw information composed in step S406 in a non-illustrated memory temporarily.

(Step S417) The processing unit 1105 determines whether or not the process of $i^{th}$ recipe step is ended. For example, if a processing time of the $i^{th}$ recipe step is predetermined, the processing unit 1105 determines whether or not the predetermined processing time has elapsed. Further, if an ending condition of the process of the $i^{th}$ recipe step is set, e.g., if it is preset that the process is supposed to end when the temperature reaches a specific temperature, determined is whether or not a processing condition is satisfied, and if satisfied, the process is determined to be ended. If the process is ended, the process proceeds to step S418; otherwise, the process returns to step S414.

(Step S418) The raw information transmitting unit 1108 transmits the raw information (here, a set of one or more kinds of measurement values, time information and a step identifier, or a set of one or more kinds of measurement values, time information, a step identifier, a sub-recipe identifier and a sub-recipe step identifier) temporarily accumulated at step 410 or step 416 to the server device 12. Further, the raw information transmitting unit 1108 retains information (e.g., an IP address of the server device 12 or the like) to communicate with the server device 12.

(Step S419) The processing unit 1105 increments the counter i by 1 and the process returns to step S403.

(Step S420) The raw information transmitting unit 1108 reads a recipe identifier from the recipe storage unit 1102. The recipe identifier is a recipe identifier of the recipe read at step S401.

(Step S421) The raw information transmitting unit 1108 reads a manufacturing apparatus identifier from the manufacturing apparatus identifier storage unit 1103.

(Step S422) The raw information transmitting unit 1108 transmits the recipe identifier and the manufacturing apparatus identifier read at steps S420 and S421 to the server device 12. Further, the raw information transmitting unit 1108 retains information (e.g., an IP address of the server device 12 or the like) to communicate with the server device 12, and then the process ends.

Figure 4:
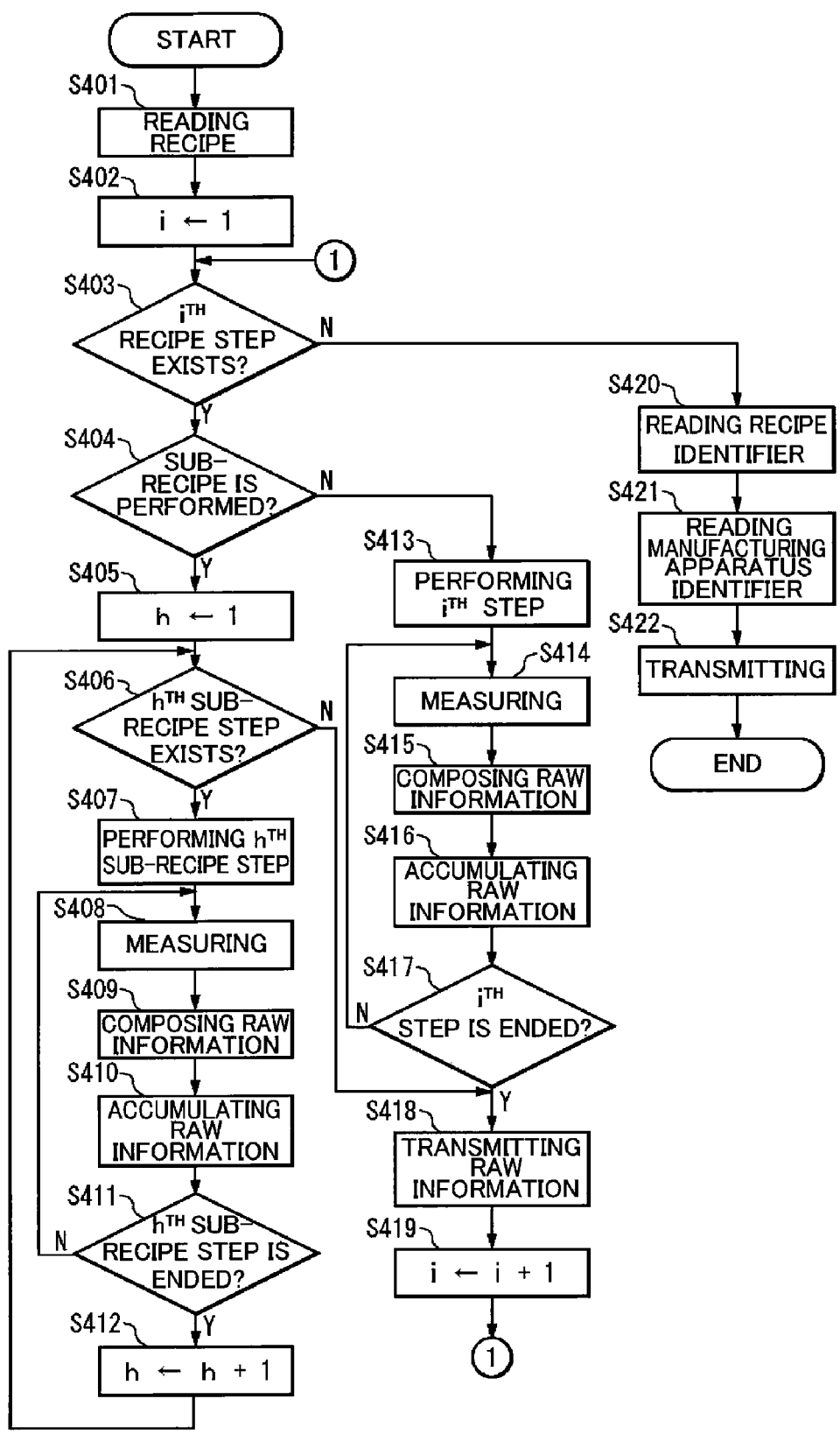
FIG. 4 is a flowchart describing an operation of a manufacturing apparatus of the group management system in accordance with the embodiment of the present invention.

Furthermore, in step S410 or step S416 of the flowchart of FIG. 4, it may be possible that the raw information accumulation unit 1107 transmits the raw information composed in step S409 or step S415 to the server device 12 in sequence as processed in step S418 instead of temporarily accumulating it in a non-illustrated memory. Processed thus, it is possible to transmit data to the server device in real-time. Further, it may be possible that the manufacturing apparatus identifier or the recipe identifier is transmitted at a start time of the measurement or is included in each of the measurement information.

Further, if the raw information does not include the step identifier in step S409 or step S415, it may be possible that the step identifier is read from the recipe storage unit 1102 prior to step S418 and transmitted to the server device 12 together with the raw information in step S418.

Hereinafter, an operation of the server device 12 will be explained with reference to a flowchart shown in FIG. 5. Further, a case where the output instruction received by the instruction receiving unit 1205 is an output instruction of the chart will be explained as an example.

(Step S501) The instruction receiving unit 1205 determines whether or not an instruction has been received. If so, the process goes to step S502; otherwise, the process proceeds to step S512.

(Step S502) The measurement information acquisition unit 1203 determines whether or not the instruction received in step S501 is an output instruction of the output information of the chart. If so, the process goes to step S503; otherwise, the process returns to step S501.

(Step S503) The measurement information acquisition unit 1203 determines whether or not the output instruction of the chart received in step S501 includes an instruction for designating a sub-recipe, specifically, a sub-recipe identifier. If so, the process proceeds to step S504; otherwise, the process returns to step S501. Further, it may be possible to acquire and output measurement information having a desired step identifier according to an instruction included in the output instruction such as an instruction for outputting the measurement information having the desired step identifier before returning to step S501.

(Step S504) The measurement information acquisition unit 1203 substitutes 1 for a counter m.

(Step S505) The measurement information acquisition unit 1203 determines whether or not the output instruction includes an instruction for designating the $m^{th}$ desired time of execution of a sub-recipe among plural times of execution of the sub-recipe. [$m^{th}$ desired time] implies that if, for example, a desired sub-recipe is executed five times and a desired number of times is set to be a second time, a third time and a fifth time, i.e., three times in total, m=1 represents the second time, m=2 represents the third time and m=3 represents the fifth time. However, as a value of m is increased, it is not necessary to select the desired number of times in sequence from the lowest value. For example, if the output instruction includes an instruction for designating measurement information acquired when the sub-recipe is executed at the second time and the third time, the measurement information acquisition unit 1203 determines that the output instruction includes an instruction for designating a sub-recipe executed at the $m^{th}$ desired times when m is ⌈1⌋ and ⌈2⌋. Further, for example, if a desired sub-recipe is executed ten times at a time of execution of a recipe and an output instruction includes an instruction for designating measurement information acquired at every time of the execution of the sub-recipe, ten times of all execution of the sub-recipe shall be designated. Therefore, if m is a value ranging from ⌈1⌋ to ⌈10⌋, the measurement information acquisition unit 1203 may determine that the output instruction includes an instruction for designating a sub-recipe executed at the $m^{th}$ desired time. Furthermore, if a value for designating the number of times of execution of the sub-recipe to be outputted is not designated for the output instruction, it is desirable to preset a value for designating a desired number of times to a default value, e.g., ⌈1⌋ or the like. If there is an instruction for designating the sub-recipe executed at the $m^{th}$ desired time, the process proceeds to step S506; otherwise, the process proceeds to step S509.

(Step S506) The measurement information acquisition unit 1203 acquires measurement information acquired when a sub-recipe corresponding to a sub-recipe identifier included in the output instruction is executed at the $m^{th}$ time from measurement information having the same manufacturing apparatus identifier and recipe identifier as those included in the output instruction, among the measurement information stored in the measurement information storage unit 1201. For example, if a desired sub-recipe is executed ten times at a time of execution of a recipe, and the output instruction includes an instruction for designating measurement information acquired when the sub-recipe is executed at the second time and the fifth time, in case of m=1, acquired is measurement information by using a measurement value measured when the sub-recipe is executed at the second time. Further, in case of m=2, acquired is measurement information by using a measurement value measured when the sub-recipe is executed at the fifth time. This process will be explained later in detail.

(Step S507) The measurement information acquisition unit 1203 temporarily stores the measurement information acquired in step S506 in a non-illustrated memory or the like. Further, if the measurement information is already stored in the memory or the like in step S506, it is not necessary to take this step.

(Step S508) The measurement information acquisition unit 1203 increments the counter m by 1 and the process returns to step S505.

(Step S509) The fault detection unit 1210 determines whether each measurement value contained in the one or more measurement information acquired in step S503 is normal or abnormal. To be specific, the fault detection unit 1210 determines whether each measurement value is normal or abnormal by using the condition information.

(Step S510) The output information composing unit 1206 composes output information such as a chart according to the output instruction received by using the measurement information obtained in step S503. At this time, a preset calculation may be performed on the measurement information. In particular, if the measurement information acquisition unit 1203 acquires the measurement information measured at the two or more different number of times among the sub-recipe executed plural number of times, it may be possible that the output information composing unit 1206 performs the preset calculation on measurement information having the same time elapsed from a predetermined start point in each sub-recipe among the measurement information corresponding to the sub-recipe at the two or more different number of times which is acquired by the measurement information acquisition unit 1203, and composes output information according to the calculation result. Further, since a method of composing new measurement information by matching two or more measurement information along the time axis and calculating a median value, a maximum value, a minimum value or the like with respect to the respective values of the measurement information is well-known in the art, a detailed description thereof will be omitted. Further, in case that the output information is a chart, property values of lines (colors or types of lines, colors or types of dots, and so forth) of the chart are instructed property values, property values of default, or the like, and the output information composing unit 1206 composes the chart by using these property values. The composed chart is a chart in which the measurement information of the different manufacturing apparatus identifiers or the measurement information of the different recipe identifiers or both of these are visually distinguishable. Furthermore, the composed chart is a chart according to chart type information (an SPC chart, a correlation chart, an MD chart, or the like) contained in the output instruction. Moreover, the output information composing unit 1206 composes the output information according to the result of the fault detection process in step S505. Here, [the output information according to the result of the fault detection process] may be output information specifying the abnormality or normality of the measurement information, a chart specifying threshold values of the abnormality and normality, or the like.

(Step S511) The output unit 1207 outputs the output information composed in step S510. Here, the term "output" implies a transmission to the client device 13. Then, the process returns to step S501.

(Step S512) The raw information receiving unit 1202 determines whether it has received one or more raw information from the manufacturing apparatuses 11. If so, the raw information is temporarily accumulated in a non-illustrated memory or the like and the process proceeds to step S508; otherwise, the process returns to step S501.

(Step S513) The measurement information accumulation unit 1204 acquires one or more measurement information by performing a preset calculation on the raw information received by the raw information receiving unit 1202. Performing the preset calculation on a plurality of raw information implies performing the preset calculation (calculation of a mean value, a standard deviation, a maximum value, or the like) on each of the one or more values in the plural pairs contained in the plurality of raw information. However, the preset calculation may not be performed. Furthermore, the plurality of raw information on which the specific calculation is performed implies each of a multiplicity of raw information obtained at a predetermined time interval (for example, 10 minutes) and each of a multiplicity of raw information obtained at every preset number of steps. In addition, the measurement information accumulation unit 1204 may appropriately add the manufacturing apparatus identifier or the recipe identifier received by the raw information receiving unit 1202 to the raw information or the measurement information received by the raw information receiving unit 1202.

(Step S514) The measurement information accumulation unit 1204 accumulates the one or more measurement information acquired in step S513 in the measurement information storage unit 1201. Then, the process goes back to step S501.

Figure 5:
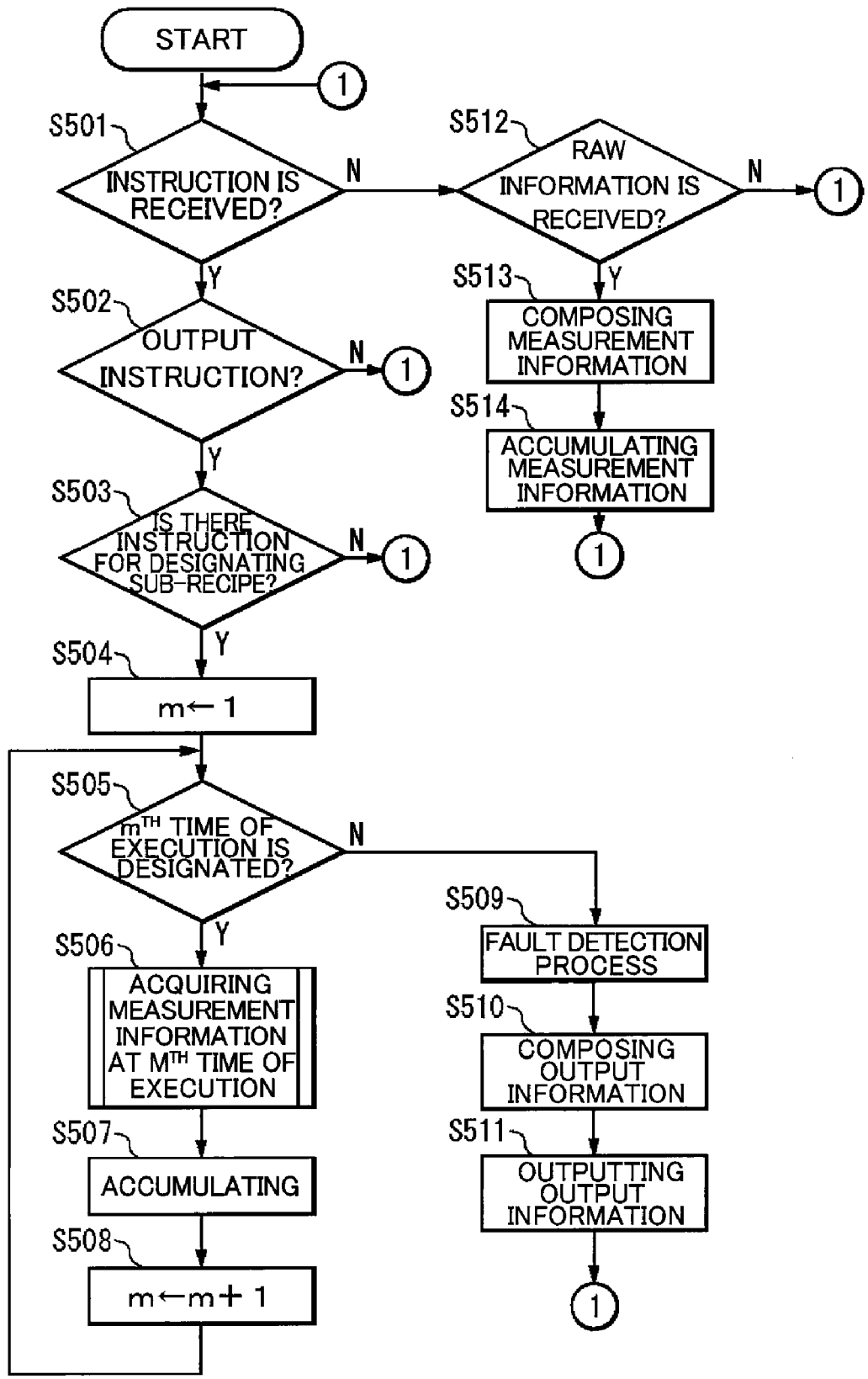
FIG. 5 presents a flowchart describing an operation of a server device of the group management system in accordance with the embodiment of the present invention.

Further, in the flowchart shown in FIG. 5, the process is terminated by an interruption of a power-off or a process termination.

Further, in the flowchart of FIG. 5, the measurement information is accumulated before the chart output instruction is received.

Furthermore, in the flowchart of FIG. 5, it may be possible that the raw information is accumulated instead of the measurement information, and when an output of the output information such as the chart is carried out, the one or more measurement information is obtained by performing the preset calculation on the plurality of raw information, and the output information may be composed by using the one or more measurement information and outputted. That is, there is no specific limitation in timing for composing the measurement information.

Hereinafter, a process of acquiring the measurement information at the $m^{th}$ execution of the sub-recipe as illustrated in step S506 in the flowchart of FIG. 5 will be explained with reference to the flowchart of FIG. 6. At this time, it is assumed that the output instruction includes: a sub-recipe identifier corresponding to a sub-recipe step executed when the measurement information to be outputted is acquired; and information indicating the $m^{th}$ execution of the sub-recipe. A value of the $m^{th}$ time of execution is, in this case, s (s is a positive integer). For example, if the $m^{th}$ time of execution is a fifth time among plural number of times of execution instructed by the output instruction, s becomes 5. Further, in this case, for a simple explanation, it is assumed that the output instruction includes the manufacturing apparatus identifier and the recipe identifier, and the measurement information is searched from the measurement information, which contains the same manufacturing apparatus identifier and recipe identifier as those contained in the output instruction, among the measurement information stored in the measurement information storage unit 1201.

(Step S601) The measurement information acquisition unit 1203 substitutes 1 for a counter n.

(Step S602) The measurement information acquisition unit 1203 substitutes 0 for a counter k.

(Step S603) The measurement information acquisition unit 1203 determines whether or not the $n^{th}$ measurement information exists in measurement information which is sorted according to time information and has the same manufacturing apparatus identifier and recipe identifier as those included in the output instruction. If so, the process proceeds to step S604; otherwise, the process returns to the higher-level function. Further, if not, it may be possible to output an error message that there is no corresponding measurement information and then return to the higher-level function.

(Step S604) The measurement information acquisition unit 1203 determines whether or not the $n^{th}$ measurement information includes a sub-recipe identifier identical with a sub-recipe identifier included in the output instruction. Here, the term "identical" may imply both "perfectly identical" and "partially identical." If so, the process proceeds to step S605; otherwise, the process proceeds to step S614.

(Step S605) The measurement information acquisition unit 1203 increments the counter k by 1.

(Step S606) The measurement information acquisition unit 1203 determines whether or not a value of the counter k is s. If so, the process proceeds to step S607; otherwise, the process proceeds to step S615.

(Step S607) The measurement information acquisition unit 1203 acquires $n^{th}$ measurement information. Further, here, it may be possible that the term "acquiring measurement information" implies acquiring only measurement value within the measurement information.

(Step S608) The measurement information acquisition unit 1203 additionally accumulates the measurement information acquired in step S607 in a non-illustrated memory or the like. Further, when accumulating the measurement information in the memory or the like, it may be possible to add a value s of the $m^{th}$ time of execution to the measurement information. Thus, it is possible to determine the measurement information is measured at which time of execution of a desired sub-recipe by outputting the value s. In the event, the measurement information accumulated in the memory becomes the measurement information acquired by the measurement information acquisition unit 1203 when the sub-recipe executed plural number of times is executed at the $m^{th}$ time.

(Step S609) The measurement information acquisition unit 1203 increments the counter n by 1.

(Step S610) The measurement information acquisition unit 1203 determines whether or not there is the $n^{th}$ measurement information in like manner as in step S603. If so, the process proceeds to step S611; otherwise, the process returns to a higher-level function. Further, if not, it may be possible to output an error message that there is no corresponding measurement information and then return to the higher-level function.

(Step S611) The measurement information acquisition unit 1203 determines whether or not the $n^{th}$ measurement information includes a sub-recipe identifier identical with a sub-recipe identifier included in the output instruction in like manner as in step S604. If so, the process proceeds to step S612; otherwise, the process returns to a higher-level function.

(Step S612) The measurement information acquisition unit 1203 determines whether or not a value of a sub-recipe step identifier corresponding to the $n^{th}$ measurement information is identical with a value of a sub-recipe step identifier corresponding to the $(n-1)^{th}$ measurement information having the same manufacturing apparatus identifier and recipe identifier as those included in the output instruction and having time information just prior to the time information of the $n^{th}$ measurement information. If so, the process goes to step S607; otherwise, the process proceeds to step S613. Meanwhile, in this case, it is assumed that the sub-recipe step identifier is set to be a value including a value increased by 1 according to a process sequence of the sub-recipe steps.

(Step S613) The measurement information acquisition unit 1203 determines whether or not a value of a sub-recipe step identifier corresponding to the $n^{th}$ measurement information is identical with a value incremented by 1 from a value of the sub-recipe step identifier corresponding to the $(n-1)^{th}$ measurement information. If so, the process returns to step S607; otherwise, the process returns to a higher-level function. Further, non-identity means that the measurement information does not satisfy a regularity of arrangement of the sub-recipe steps constituting the sub-recipe. By this process, it is possible to determine whether or not plural sub-recipe steps constituting a sub-recipe have been executed repeatedly, thereby determining that the sub-recipe has been executed repeatedly. In case the sub-recipe has been executed iteratively, the number of execution time of the sub-recipe is changed at that time so that a process of acquiring measurement values is terminated.

(Step S614) The measurement information acquisition unit 1203 increments the counter n by 1, and then the process returns to step S603.

(Step S615) The measurement information acquisition unit 1203 increments the counter n by 1.

(Step S616) The measurement information acquisition unit 1203 determines whether or not there is the $n^{th}$ measurement information in like manner as in step S603. If so, the process proceeds to step S617; otherwise, the process returns to a higher-level function. Further, if not, it may be possible to output an error message that there is no corresponding measurement information and then return to the higher-level function.

(Step S617) The measurement information acquisition unit 1203 determines whether or not the $n^{th}$ measurement information includes a sub-recipe identifier identical with a sub-recipe identifier included in the output instruction in like manner as in step S604. If so, the process proceeds to step S618; otherwise, the process proceeds to step S620.

(Step S618) The measurement information acquisition unit 1203 determines whether or not a value of a sub-recipe step identifier corresponding to the $n^{th}$ measurement information is identical with a value of a sub-recipe step identifier corresponding to the $(n-1)^{th}$ measurement information in like manner as in step S612. If so, the process goes back to step S615; otherwise, the process proceeds to step S619.

(Step S619) The measurement information acquisition unit 1203 determines whether or not a value of a sub-recipe step identifier corresponding to the $n^{th}$ measurement information is identical with a value incremented by 1 from a value of the sub-recipe step identifier corresponding to the $(n-1)^{th}$ measurement information in like manner as in step S613. If so, the process returns to step S615; otherwise, the process returns to step S605.

Figure 6:
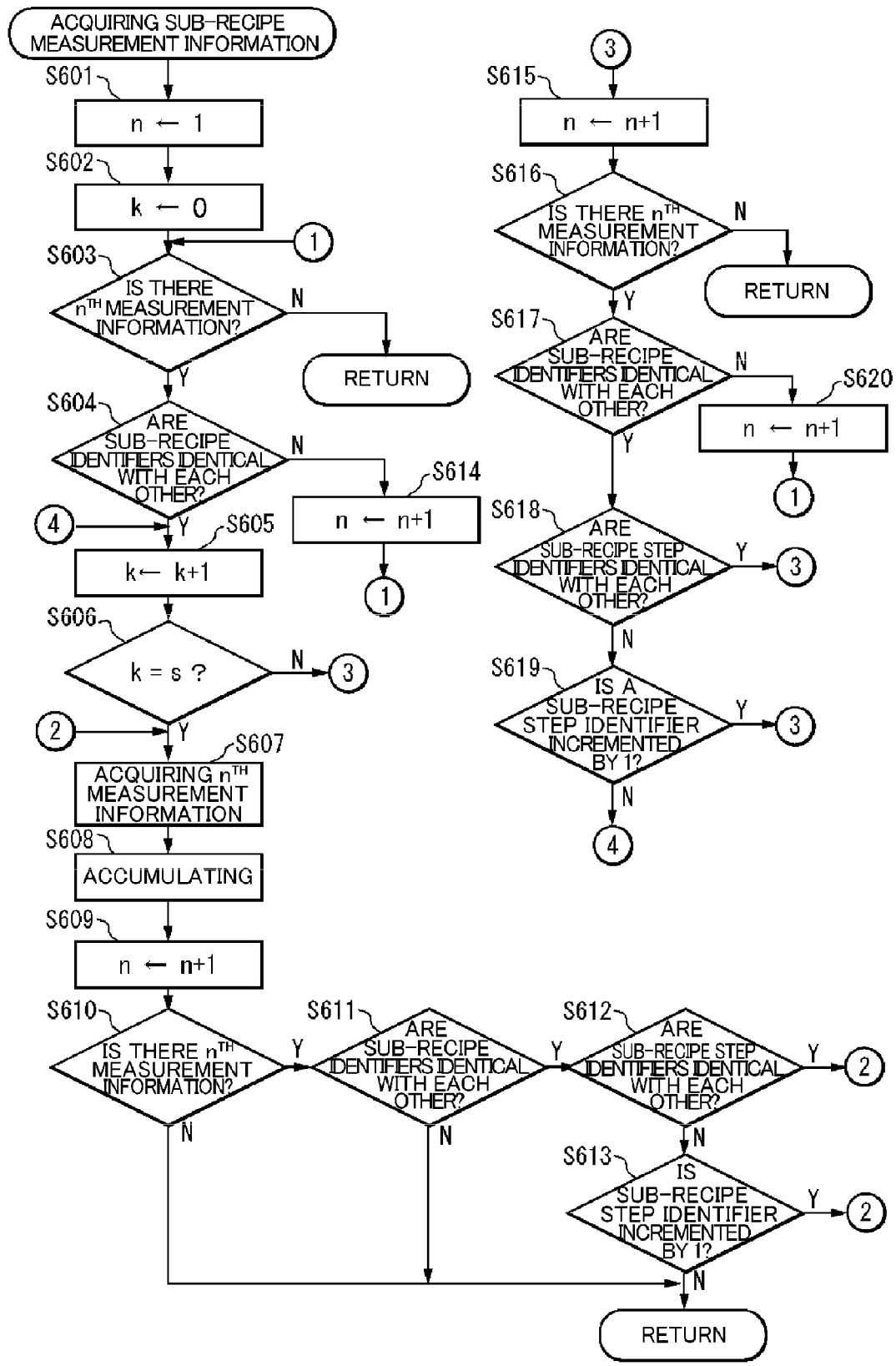
FIG. 6 is a flowchart to describe a process for obtaining measurement information in the server device of the group management system in accordance with the embodiment of the present invention.

Further, in the flowchart of FIG. 6, the process is terminated by an interruption of a power-off or a process termination.

Moreover, in the flowchart shown in FIG. 6, if it is already known that there is no case where a sub-recipe is repeatedly and continuously executed, it is not necessary to take a step of determining whether the sub-recipe step has been repeatedly performed so that it may be possible to omit steps S612 and S613 and steps S618 and S619. In this case, if it is determined that the values of the sub-recipe step identifiers are identical with each other in step S612, the process returns to step S607; if it is determined that the values of the sub-recipe step identifiers are identical with each other in step S618, the process returns to step S615.

Moreover, in the flowcharts shown in FIGS. 5 and 6, it is desirable that the fault detection is started in real-time by inputting an output instruction of the output information by a user, and the fault detection process is performed while updating the output information (chart or the like) whenever the raw information is received, and a fault, if any, is immediately informed to the user. That is, in the flowcharts of FIGS. 5 and 6, it is more desirable to perform the following processes. For example, the raw information receiving unit 1202 receives the raw information which is continuously transmitted from the manufacturing apparatuses 11 on a real-time basis during the manufacture in the manufacturing apparatuses 11, and the measurement information accumulation unit 1204 accumulates the measurement information in the measurement information storage unit 1201 at least temporarily and in sequence. It may be possible that the measurement information acquisition unit 1203 performs the processes of steps S503 to S619 on the measurement information whenever the measurement information is accumulated. Here, in the flowchart in FIG. 6, it may be possible to appropriately treat the above-stated measurement information accumulated in sequence as the $n^{th}$ measurement information, and when incrementing the counter n by 1, it may be possible to appropriately treat measurement information accumulated next. By this process, it is possible to check the state of the manufacturing apparatus 11 in real-time, and also since the fault detection is carried out in real-time, the user can immediately recognize an occurrence of the fault.

Further, if an instruction for acquiring the measurement values at every execution of a desired sub-recipe is received, it may be possible to omit the process of step S505 illustrated in the flowchart in FIG. 5, and acquire the measurement values at every execution by setting a value of the $m^{th}$ time of execution to be m, i.e., to be m=s and repeating the process of step S506, i.e., the process illustrated in the flowchart in FIG. 6 while incrementing the value of m by 1, and if the measurement value is not acquired during the process of step S506, i.e., the process illustrated in the flowchart in FIG. 6 due to an error message output, the process may proceed to step S509.

Otherwise, it may be possible to acquire the measurement values measured at every execution of the desired sub-recipe by acquiring measurement information containing the desired sub-recipe identifier for each different step identifier.

Hereinafter, the operation of the client device 13 will be explained. When the instruction input unit 1301 of the client device 13 receives an output instruction of the chart from the user, the instruction transmitting unit 1302 transmits the output instruction to the server device 12, and the receiving unit 1303 receives the information of the chart which is the processed result from the server device 12, and then the display unit 1304 displays the chart.

Hereinafter, a detailed operation of the group management system in accordance with the present embodiment will be explained. FIG. 1 provides a conceptual diagram of the group management system.

FIG. 7 is a recipe management table for managing a recipe stored in the recipe storage unit 1102 of one or more manufacturing apparatuses 11. The recipe management table has properties such as [recipe identifier], [step identifier] and [processing condition]. [Recipe identifier] is a recipe identifier; [step identifier] is a step identifier of a step constituting the recipe; and [processing condition] is related to a setting of a processing condition, e.g., a processing time, processing temperature or the like for each step. Further, if a property value of [step identifier] is a sub-recipe identifier, it is indicated that a process of such a sub-recipe is executed at the step.

FIG. 8 is a sub-recipe management table for managing a sub-recipe stored in the recipe storage unit 1102 of one or more manufacturing apparatuses 11. The sub-recipe management table has properties such as [sub-recipe identifier], [sub-recipe step identifier] and [processing condition]. [Sub-recipe identifier] is a sub-recipe identifier; [sub-recipe step identifier] is a sub-recipe step identifier of a sub-recipe step constituting the sub-recipe; and [processing condition] is related to a setting of a processing condition, e.g., a processing time, processing temperature or the like for each sub-recipe step. Further, the sub-recipe and the sub-recipe step are basically the same as the recipe and the step so that it may be possible to use the recipe instead of the sub-recipe.

In this example, when the input receiving unit 1101 of the one or more manufacturing apparatuses 11 receives a startup instruction for processing a wafer from the user, the processing unit 1105 reads a recipe from the recipe storage unit 1102 and performs a wafer processing by executing the read recipe at each recipe step. Further, during the wafer processing, the measuring unit 1106 measures a gas flow rate within a predetermined furnace at an interval of, e.g., one second, and composes the raw information made of a set of the acquired gas flow rate, the time information acquired from the time measuring unit 1104 and the step identifier acquired from the recipe storage unit 1102. If the step performed at this time is a step of executing a sub-recipe, sub-recipe steps constituting the sub-recipe are executed in sequence. Further, the raw information made of a set of the sub-recipe identifier and the sub-recipe step identifier under execution are composed in addition to the measurement values such as the acquired gas flow rate and the like, the time information acquired from the time measuring unit 1104, the step identifier acquired from the recipe storage unit 1102. The composed raw information is temporarily accumulated by the raw information accumulation unit 1107. An example of the accumulated raw information is shown in FIG. 9. In this case, for a simple explanation, there has been explained a case where the measurement value is a measurement value of the gas flow rate as an example which will be explained in the same manner hereafter. Further, with respect to the raw information in which the sub-recipe identifier and the sub-recipe step identifier do not exist, these identifiers may be omitted or information indicating that these identifiers are not included therein may be stored at a location where the identifiers are stored. Here, the raw information includes the step identifier, the sub-recipe identifier, the sub-recipe step identifier, the gas flow rate and the time information. Further, the time information is information indicating time, and it may include hour, minute and second or just include date and hour. Further, the raw information may include information of a data type (a kind of data of the measurement information such as the gas flow rate, the temperature, the pressure or the like); in particular, here it may include information indicating the gas flow rate.

Furthermore, at the step when all the steps constituting the recipe are finished, the raw information transmitting unit 1108 in the manufacturing apparatuses 11 transmits the raw information accumulated by the raw information accumulation unit 1107 to the server device 12. Further, the raw information transmitting unit 1108 in the manufacturing apparatuses 11 reads the manufacturing apparatus identifier in the manufacturing apparatus identifier storage unit 1103 and the recipe identifiers (recipe identifiers executed when a preset process is performed on a target substrate) in the recipe storage unit 1102, and transmits them to the server device 12. Here, though the raw information is transmitted to the server device 12 when all the recipe steps are completed, it may be possible to transmit the raw information to the server device 12 in real-time, for example, whenever single raw information is acquired.

Thereafter, the raw information receiving unit 1202 of the server device 12 receives the raw information made of a group of the step identifier, the gas flow rate and the time information. Further it receives the manufacturing apparatus identifier and the recipe identifier. Further, the measurement information accumulation unit 1204 accumulates, in a non-illustrated memory, the raw information containing a plurality of groups of the step identifier, the gas flow rate and the time information; the recipe identifier; and the manufacturing apparatus identifier. An example of the raw information is shown in FIG. 10. FIG. 10 provides a raw information management table. The raw information management table includes [manufacturing apparatus identifier], [recipe identifier], [step identifier], [sub-recipe identifier], [sub-recipe step identifier], [value (gas flow rate)] and [time information]. The raw information management table of FIG. 10 shows a data structure in which a plurality of groups of values (here, only one kind of value), the step identifiers and the time information correspond to a single manufacturing apparatus identifier and a single recipe identifier. Further, in FIG. 10, the raw information corresponding to the execution of the one or more manufacturing apparatuses 11 and the plurality of recipes are managed. Further, the values of the raw information shown in FIG. 10 are information prepared for the explanation, and are not actual measurement values.

Subsequently, the measurement information accumulation unit 1204 acquires a plurality of measurement information by performing a specific calculation on the plurality of the raw information shown in FIG. 10. Here, the specific calculation is a calculation of a mean value, and the measurement information accumulation unit 1204 calculates the mean value every ten (10) seconds. The measurement information accumulation unit 1204 accumulates the plurality of the measurement information in the measurement information storage unit 1201. FIG. 11 illustrates a measurement information management table for managing the measurement information accumulated in the measurement information accumulation unit 1204. The measurement information management table includes [manufacturing apparatus identifier], [recipe identifier], [step identifier], [sub-recipe identifier], [sub-recipe step identifier], [mean value (gas flow rate)] and [time information]. [Manufacturing apparatus identifier], [recipe identifier], [step identifier], [sub-recipe identifier], [sub-recipe step identifier] and [time information] are the same as those provided in FIG. 10. Further, the mean value is calculated by the measurement information accumulation unit 1204.

Moreover, the condition information storage unit 1209 stores therein condition information [260<=gas flow rate<=280] for determining normality/abnormality of a gas flow rate within a furnace.

Figure 12:
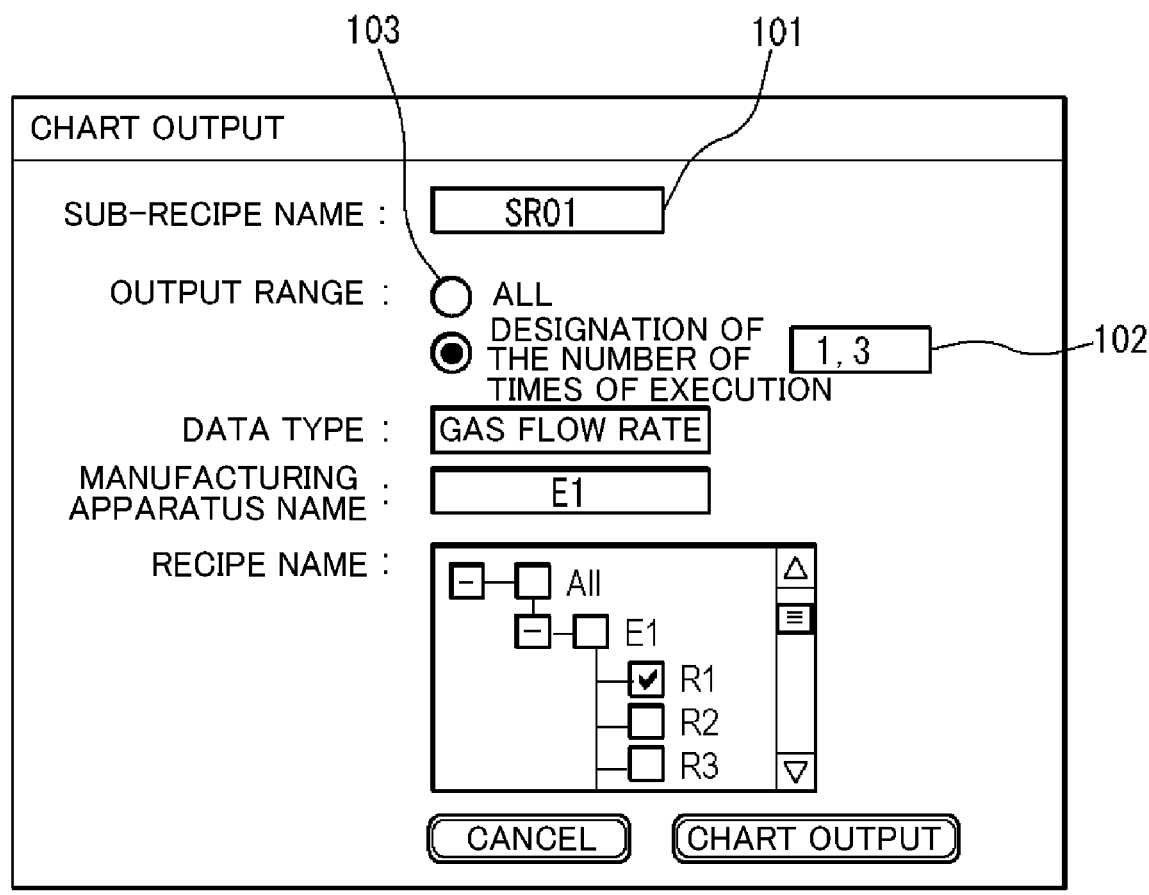
FIG. 12 is a view of illustrating a display example of a client device of the group management system in accordance with the embodiment of the present invention.

Under this circumstance, the user inputs necessary information on a screen shown in FIG. 12 from the client device 13 and presses a button of [chart output]. FIG. 12 is a screen for outputting the chart by inputting the chart output instruction. Here, the necessary information includes the information for specifying a sub-recipe to be outputted, to be specific, a sub-recipe identifier and information specifying one or more number of times of execution of the sub-recipe, in this case, the information specifying the first time and third time. As illustrated in FIG. 12, the sub-recipe identifier is inputted in a field 101 and a value specifying the number of times of execution of the output target is inputted in a field 102. Further, if a check box 103 designating [all] is checked, all of the execution are designated to be outputted. Except this information, one or more information among the data type (a kind of data of the measurement information such as the gas flow rate, the temperature, the pressure or the like), the manufacturing apparatus identifier and the recipe identifier is to be appropriately designated. In FIG. 12, a sub-recipe identifier [SR01], the number of times of execution [1, 3], a data type [gas flow rate], a manufacturing apparatus identifier [E1] and a recipe identifier [R1] are to be inputted. Accordingly, under this circumstance, if the user presses a [chart output] button, the instruction input unit 1301 receives an output instruction to output measurement information coincident with conditions of [sub-recipe identifier =SR01], [number of times of execution =1, 3[, [manufacturing apparatus identifier =E1] and [recipe identifier =R1] among the measurement information of [gas flow rate] (e.g., the information shown in FIG. 11). Further, the output instruction can be, e.g., [chart output a sub-recipe identifier="SR01", the number of times of execution ="1, 3", a data type ="gas flow rate", a manufacturing apparatus identifier ="E1", and a recipe identifier ="R1"].

Subsequently, the instruction transmitting unit 1302 transmits the output instruction [chart output a sub-recipe identifier="SR01", the number of times of execution="1, 3", a data type="gas flow rate", a manufacturing apparatus identifier="E1" and a recipe identifier="R1"], to the server device 12.

Thereafter, the instruction receiving unit 1205 of the server device 12 receives the output instruction [chart output a sub-recipe identifier="SR01", the number of times of execution="1, 3", a data type="gas flow rate", a manufacturing apparatus identifier="E1" and a recipe identifier="R1"].

Then, the measurement information acquisition unit 1203 of the server device 12 searches for and acquires the measurement information coincident with the output instruction [chart output a sub-recipe identifier="SR01", the number of times of execution="1, 3", a data type="gas flow rate", a manufacturing apparatus identifier="E1" and a recipe identifier="R1"] from the measurement information stored in the measurement information storage unit 1201.

First of all, the measurement information acquisition unit 1203 acquires measurement information on a sub-recipe executed at the first time. The measurement information acquisition unit 1203 sets the number of times of execution to be [1] based on the measurement information management table illustrated in FIG. 11. Thereafter, the measurement information acquisition unit 1203 sets a value of the counter n to be 1 and determines in sequence whether or not the sub-recipe identifier is identical with SR01 included in the output instruction with respect to the $n^{th}$ measurement information along the time axis among the measurement information containing the manufacturing apparatus identifier "E1" and the recipe identifier "R1" while incrementing the counter n by 1. In this case, since the measurement information containing the step identifier [S1] does not have any sub-recipe identifier, it is determined that initial measurement information among the measurement information having the step identifier [S2], i.e., the measurement information having [time information] of [2005/12/02 16:20:00] has a sub-recipe identifier identical with the sub-recipe identifier "SR01". Then, a value of the counter k is set to be ⌈1⌉. Since the value of the counter k is identical with the number of times of execution ⌈1⌉, the measurement information acquisition unit 1203 acquires this measurement information and accumulates it in a memory or the like. Further, it may be possible to acquire and accumulate only a property value of ⌈value (gas flow rate)⌉ The measurement information acquisition unit 1203 acquires other measurement information in this way as well.

Thereafter, the measurement information acquisition unit 1203 increments the counter n by 1 and determines whether or not a sub-recipe identifier of the $n^{th}$ measurement information is identical with the sub-recipe identifier SR01 included in the output instruction. In this case, ⌈sub-recipe identifier⌉ of the measurement information having ⌈time information⌉ of ⌈2005/12/02 16:20:10⌉ is identical with ⌈SR01⌉ included in the output instruction.

Subsequently, it is determined whether or not a sub-recipe step identifier of the $n^{th}$ measurement information is identical with a sub-recipe step identifier of the $(n-1)^{th}$ measurement information or a value whose numerical part is incremented by 1 from the sub-recipe step identifier of the $(n-1)^{th}$ measurement information. In this case, it is identical with the sub-recipe step identifier of the $(n-1)^{th}$ measurement information so that this measurement information is acquired and accumulated.

Then, the same process is repeatedly performed. Meanwhile, during a period from ⌈time information⌉ of ⌈2005/12/02 16:20:00⌉ to ⌈time information⌉ of ⌈2005/12/02 16:24:50⌉, the sub-recipe is not repeated but each of a sub-recipe step of a sub-recipe step identifier SRS004 and a sub-recipe step of a sub-recipe step identifier SRS005 is executed just once. The values of the numerical parts of the sub-recipe step identifiers of the measurement information monotonously increase from SRS004 to SRS005 along the time axis. Further, at the time when the $n^{th}$ measurement information becomes measurement information having ⌈time information⌉ of ⌈2005/12/02 16:25: 00⌉, a sub-recipe identifier of this measurement information does not become ⌈SR01⌉ so that a process of acquiring the measurement information obtained when the sub-recipe is executed at the first time ends. Thus, the measurement information for the period from ⌈time information⌉ of ⌈2005/12/02 16:20: 00⌉ to ⌈time information⌉ of ⌈2005/12/02 16:24:50⌉ is acquired by the measurement information acquisition unit 1203. Furthermore, at the time of ending the process, the value of the number of times of execution s is added to the measurement information and then accumulated.

Thereafter, the measurement information acquisition unit 1203 acquires measurement information on a sub-recipe executed at the third time set as the second desired time of execution. The measurement information acquisition unit 1203 sets the number of times of execution s to be ⌈3⌉ based on the measurement information management table illustrated in FIG. 11. Then, the measurement information acquisition unit 1203 sets a value of the counter n to be 1 and determines in sequence whether or not the sub-recipe identifier is identical with the sub recipe identifier SR01 included in the output instruction with respect to the $n^{th}$ measurement information along the time axis among the measurement information containing the manufacturing apparatus identifier "E1" and the recipe identifier "R1" while incrementing the counter n by 1. In this case, since the measurement information having the step identifier ⌈S1⌋ does not have any sub-recipe identifier, it is determined that initial measurement information among the measurement information having the step identifier ⌈S2⌋, i.e., the measurement information having ⌈time information⌋ of ⌈2005/12/02 16:20:00⌋ has a sub-recipe identifier identical with "SR01". Then, an initial value ⌈0⌋ of the counter k is incremented by 1 to be ⌈1⌋, Since the value of the counter k is not identical with the value ⌈3⌋ of the number of times of execution s, the measurement information acquisition unit 1203 does not acquire the measurement information.

Thereafter, the measurement information acquisition unit 1203 increments the counter n by 1 and determines whether or not a sub-recipe identifier of the $n^{th}$ measurement information is identical with the sub-recipe identifier SR01 included in the output instruction. In this case, they are identical with each other, and then it is determined whether or not the sub-recipe step identifier of the $n^{th}$ measurement information is identical with a sub-recipe step identifier of the $(n-1)^{th}$ measurement information or a value whose numerical part is incremented by 1 from the sub-recipe step identifier of the $(n-1)^{th}$ measurement information. In this case, since they are identical with each other, by incrementing the counter n by 1 again, there will be repeated the process of determining whether or not the sub-recipe identifier of the $n^{th}$ measurement information is identical with the sub-recipe identifier SR01 included in the output instruction and the process of determining whether or not the sub-recipe step identifier of the $n^{th}$ measurement information is identical with the sub-recipe step identifier of the $(n-1)^{th}$ measurement information or a value whose numerical part is incremented by 1 from the sub-recipe step identifier of the $(n-1)^{th}$ measurement information.

Further, at the time when the $n^{th}$ measurement information becomes measurement information having ⌈time information⌋ of ⌈2005/12/02 16: 25:00⌋, a sub-recipe identifier of this measurement information does not become ⌈SR01⌋ so that a process of acquiring the measurement information corresponding to the sub-recipe executed at the first time ends.

Then, while incrementing the counter n by 1 again, the measurement information acquisition unit 1203 determines in sequence whether or not the sub-recipe identifier is identical with the sub-recipe identifier SR01 included in the output instruction with respect to the $n^{th}$ measurement information along the time axis among measurement information having the manufacturing apparatus identifier "E1" and the recipe identifier "R1". In this case, ⌈sub-recipe identifier⌋ of the measurement information having ⌈time information⌋ of ⌈2005/12/02 16:55:00⌋ is identical with ⌈SR01⌋ of the output instruction. Thereafter, a value of the counter k is incremented by 1 and set to be ⌈2⌋. Since the value of the counter k is not identical with the number of times of execution s ⌈3⌋, the measurement information acquisition unit 1203 does not acquire the measurement information.

In addition, the measurement information acquisition unit 1203 increments the counter n by 1 and determines whether or not the sub-recipe identifier of the n th measurement information is identical with the sub-recipe identifier SR01 included in the output instruction. In this case, they are identical with each other, and then it is determined whether or not the sub-recipe step identifier of the $n^{th}$ measurement information is identical with a sub-recipe step identifier of the $(n-1)^{th}$ measurement information or a value whose numerical part is incremented by 1 from the sub-recipe step identifier of the $(n-1)^{th}$ measurement information. In this case, since they are identical with each other, by incrementing the counter n by 1 again, there will be repeated the process of determining whether or not the sub-recipe identifier of the $n^{th}$ measurement information is identical with the sub-recipe identifier SR01 included in the output instruction and the process of determining whether or not the sub-recipe step identifier of the n th measurement information is identical with the sub-recipe step identifier of the (n−1)$^{th}$ measurement information or a value whose numerical part is incremented by 1 from the sub-recipe step identifier of the (n−1)$^{th}$ measurement information.

Here, when the n$^{th}$ measurement information becomes measurement information having time information of [2005/12/02 17:00:00], a numerical part [004] of a sub-recipe step identifier [SRS004] becomes smaller than a numerical part [005] of a sub-recipe step identifier [SRS005] of the measurement information which is the (n-1)$^{th}$ measurement information having [time information] of [2005/12/02 16:59:50 ]. By this reason, it is determined that the sub-recipe step identifier of the n$^{th}$ measurement information is not identical with the sub-recipe step identifier of the (n-1)$^{th}$ measurement information or a value whose numerical part is incremented by 1 from the sub-recipe step identifier of the (n-1)$^{th}$ measurement information. Further, a value of the counter k is incremented by 1 and set to be [3]. Since the value of the counter k is identical with the number of times of execution s [3], this n$^{th}$ measurement information is acquired.

In addition, the measurement information acquisition unit 1203 increments the counter k by 1 and determines whether or not the sub-recipe identifier of the n$^{th}$ measurement information is identical with the sub-recipe identifier SR01 included in the output instruction. In this case, [sub-recipe identifier] of the measurement information having [time information] of [2005/12/02 17:00:10 ] is identical with [SR01] of the output instruction.

Subsequently, it is determined whether or not the sub-recipe step identifier of the n$^{th}$ measurement information is identical with the sub-recipe step identifier of the (n−1)$^{th}$ measurement information or a value whose numerical part is incremented by 1 from the sub-recipe step identifier of the (n−1)$^{th}$ measurement information. In this case, it is identical with the sub-recipe step identifier of the (n−1)$^{th}$ measurement information so that this measurement information is acquired and accumulated.

Thereafter, the same process is repeatedly performed. Meanwhile, during a period from [time information] of [2005/12/02 17:00:00] to [time information] of [2005/12/02 17:04:50], the sub-recipe is not repeated but each of a sub-recipe step of a sub-recipe step identifier SRS004 and a sub-recipe step of a sub-recipe step identifier SRS005 is executed just once. The values of the numerical parts of the sub-recipe identifiers of the measurement information monotonously increase from SRS004 to SRS005 along the time axis. Further, at the time when the n$^{th}$ measurement information becomes measurement information having [time information] of [2005/12/02 17:05:00], a sub-recipe identifier of this measurement information does not become [SR01] so that a process of acquiring the measurement information acquired when the sub-recipe is executed at the third time ends. Thus, the measurement information for the period from [time information] of [2005/12/02 17:00:00] to [time information] of [2005/12/02 17:04:50] is acquired by the measurement information acquisition unit 1203.

FIG. 13 shows an acquired information management table for managing measurement information acquired by the measurement information acquisition unit 1203. The acquired information management table includes [manufacturing apparatus identifier], [recipe identifier], step identifier], [sub-recipe identifier], [sub-recipe step identifier], [mean value (gas flow rate)] and [time information]. [Manufacturing apparatus identifier], [recipe identifier], [step identifier], [sub-recipe identifier], [sub-recipe step identifier], [mean value (gas flow rate)] and [time information] are the same as those illustrated in FIG. 10.

In this case, if an output instruction for acquiring measurement information obtained when the sub-recipe is executed at the second time, for example, instead of the first and third times as the number of execution is received, measurement information obtained from a time when the value of the counter k meets s=2 to a time right before the value of the counter k meets s=3, i.e., measurement information for a period from [time information] of [2005/12/02 16:55:00] to [time information] of [2005/12/02 16 : 59:50] is acquired.

Thereafter, the fault detection unit 1210 acquires the measurement information as illustrated in FIG. 11 from the measurement information acquisition unit 1203, reads the condition information [260<=gas flow rate <=280] from the condition information storage unit 1209, and detects a fault of measurement information obtained from each time of execution of the sub-recipe by using the condition information. For example, all of the [mean values] of the measurement information shown in FIG. 13 are less than 260 so that they are determined to be fault values.

Thereafter, the output information composing unit 1206 composes a chart as output information by using the information in FIG. 13 acquired by the measurement information acquisition unit 1203 and the determination result of the fault detection unit 1210. The chart is a line graph in which a horizontal axis represents time indicating time information and a vertical axis represents a value (mean value of gas flow rates). Further, the time is indicated by a relative time in which a start time of the sub-recipe is zero minute and zero second. Besides, graphs are composed differently for each time of execution.

Afterwards, the output unit 1207 transmits the line graph composed by the output information composing unit 1206 to the client device 13.

Figure 14:
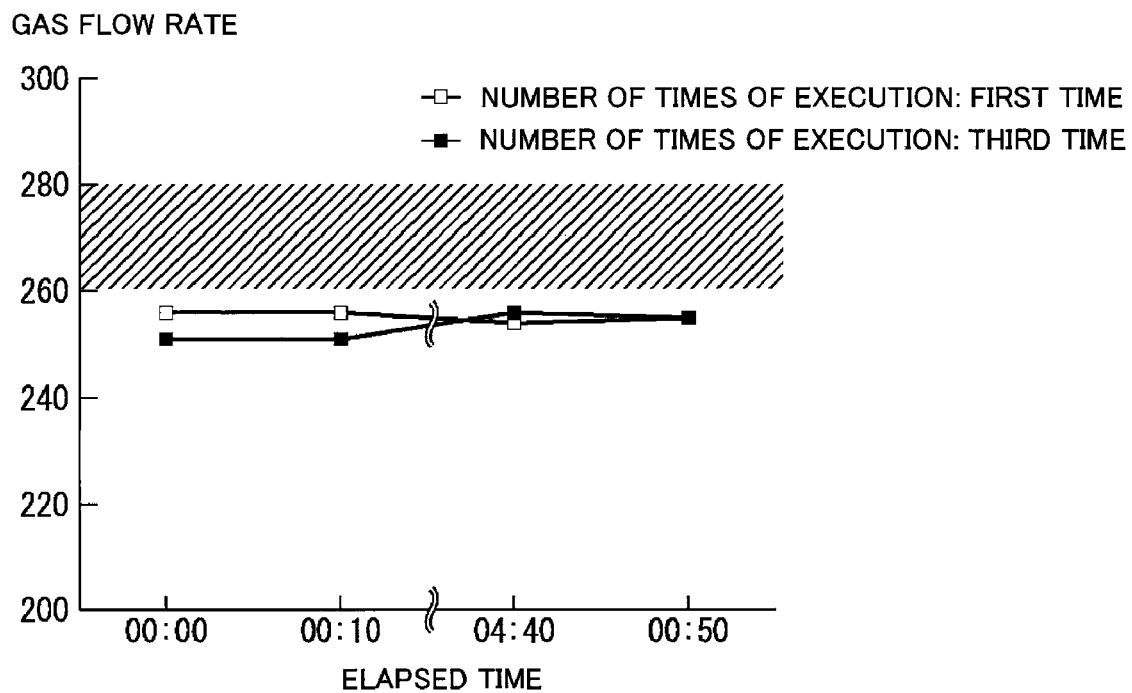
FIG. 14 is a view of showing a display example of the client device of the group management system in accordance with the embodiment of the present invention.

The receiving unit 1303 of the client device 13 receives the line graph, and the display unit 1304 displays the line graph on a display, as illustrated in FIG. 14. In FIG. 14, a normal range is marked by slanting lines and explanatory notes composed by the output information composing unit 1206 by using a value of [the number of times of execution] included in the measurement information is outputted.

Figure 15:
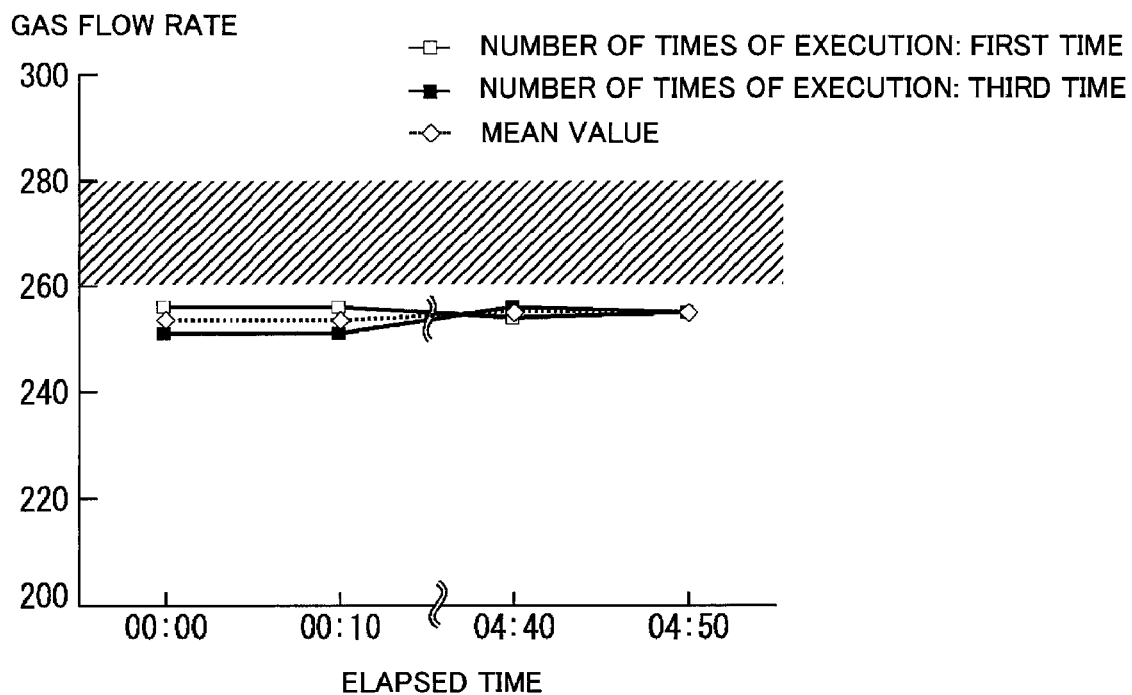
FIG. 15 provides a view of illustrating a display example of the client device of the group management system in accordance with the embodiment of the present invention.

Further, in this case, it may be possible that the output information composing unit 1206 calculates mean values of measurement information having the same time elapsed from a start time of the sub-recipe among the measurement information at the different number of times as illustrated in FIG. 15, composes a graph of the mean values and then outputs it by overlapping it with the graph illustrated in FIG. 14.

Besides, in the above-stated embodiment, if an instruction to acquire measurement values obtained from every execution of a desired sub-recipe is received, it may be possible to acquire measurement information corresponding to a sub-recipe in the same way as in the above-stated example whenever the value of the counter k is incremented by 1, for example. In this case, a process may be terminated at the time when measurement information which is a target to be processed, e.g., the n$^{th}$ measurement information of the above-stated embodiment disappears.

Further, in the above-stated embodiment, an identifier whose value or whose value of its numerical part is incremented by 1 according to a execution sequence of a sub-recipe step was used as a sub-recipe step identifier relating to sub-recipe steps within the same sub-recipe, and if a value or a value of numerical part of the sub-recipe step identifier of the measurement information was not identical with the sub-recipe identifier contained in measurement information just prior to the measurement information or was not a value incremented by 1 therefrom, the number of times of execution of the sub-recipe was counted up. However, in the present embodiment, it may be also possible that the sub-recipe step identifier for the sub-recipe steps within the same sub-recipe has a predetermined regularity capable of specifying an arrangement sequence of the sub-recipe steps, e.g., a regularity that each of the sub-recipe step identifiers has one of characters arranged in alphabetical order such as a, b, c, and the like, or a regularity that each of the sub-recipe step identifiers has a value decremented by 1 according to the process sequence. Then, if it is determined that the sub-recipe step identifier of the measurement information does not satisfy this regularity, it may be possible to count up the number of times of execution of the sub-recipe.

In view of the foregoing, in accordance with the present embodiment, by designating the number of times of execution of the sub-recipe, it is possible to selectively output measurement information obtained at the designated number of times with respect to the measurement information acquired from the repeatedly executed sub-recipe and accumulated in the server device 12. Through this process, only the necessary information can be provided instantly so that it is possible to efficiently perform a monitoring including a fault detection process in the manufacturing apparatus or the like.

Further, by displaying the measurement information acquired from different time of execution of the same sub-recipe in one chart, it becomes easy to compare the measurement information, or it is possible to find irregularity of the measurement information caused by a difference in the number of times of execution or to acquire desired measurement values by performing a preset calculation, thereby enhancing the usefulness of the measurement information obtained from the sub-recipe.

Moreover, in the above-stated embodiment, in the server device 12, by counting the number of times of appearance of a measurement information group corresponding to a desired sub-recipe, the measurement information group corresponding to the number of times of execution of the sub-recipe was detected and acquired. However, in the present embodiment, it may be also possible to detect and acquire measurement information corresponding to the number of times of execution of a sub-recipe as follows. That is, whenever the same sub-recipe such as a sub-recipe having the same sub-recipe identifier is executed once in the manufacturing apparatus 11, the number of times of execution of the sub-recipe is counted by a counter or the like and information indicating the counted result is added to all the raw information, initial raw information or final raw information obtained from the sub-recipe, whereby the measurement information accumulated in the server device 12 includes the information indicating the counted result of the number of times of execution of the sub-recipe. Further, in the server device 12, it may be also possible to detect and acquire measurement information corresponding to a desired number of times of execution designated by the output instruction based on the information indicating the counted result which is contained in the measurement information.

Figure 16:
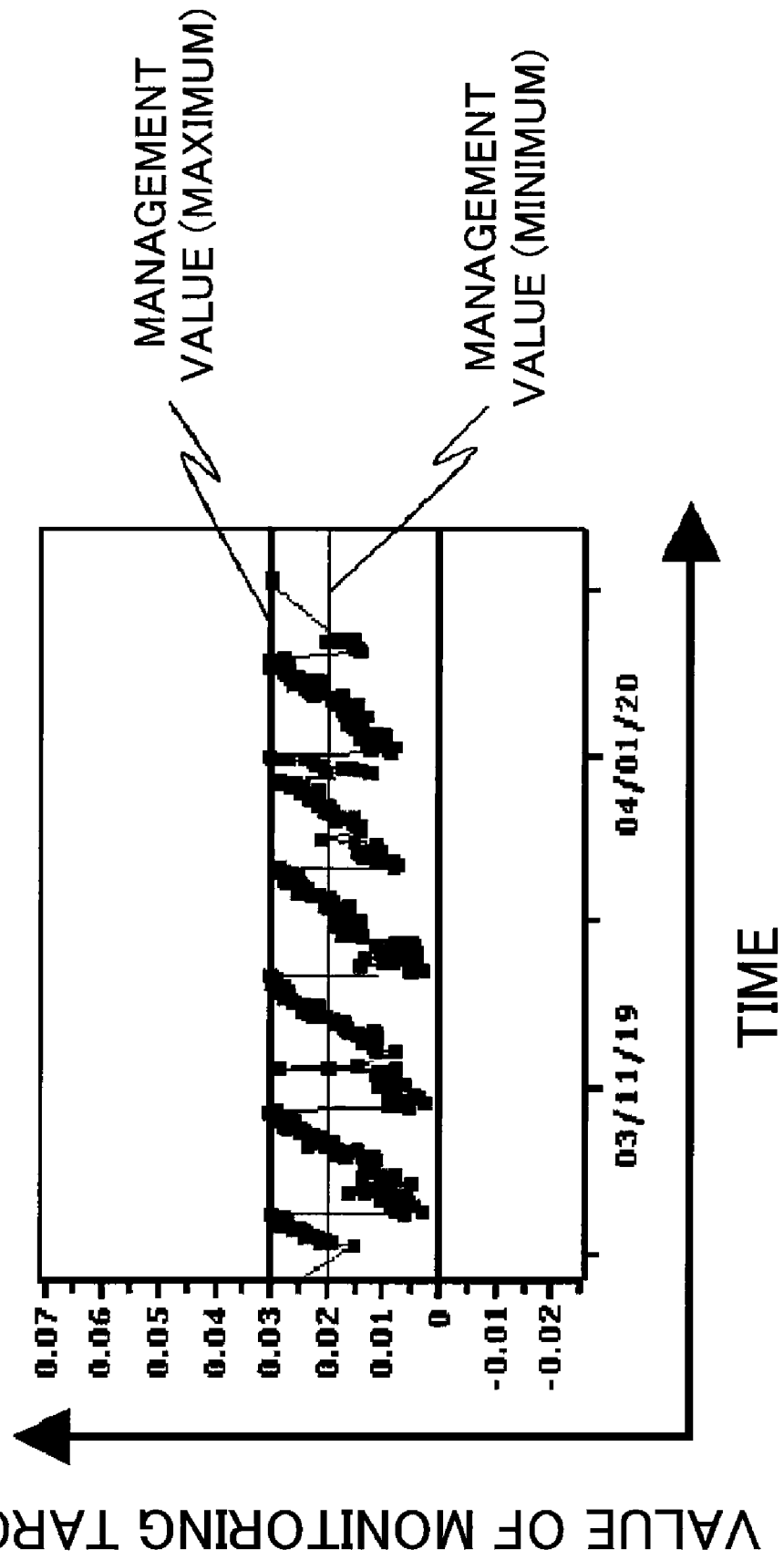
FIG. 16 is a diagram of showing a display example of the client device of the group management system in accordance with the embodiment of the present invention.

In addition, in the present embodiment, the outputted chart may be an SPC chart, as illustrated in FIG. 16, visually distinguishing the measurement information of the different manufacturing apparatus identifiers or the different recipe identifiers or both of them among a plurality of measurement information read from the measurement information storage unit 1201 to be coincident with an output instruction which is an instruction for outputting an SPC chart, and plotting the read plurality of measurement information according to a time sequence indicated by time information included in any one kind of measurement information. Further, the SPC chart shown in FIG. 16 is a chart including, for example, measurement information of a single manufacturing apparatus identifier. Further, on the SPC chart shown in FIG. 16, a management value (maximum) and a management value (minimum) are outputted. When a certain measurement value is out of the range of these management values, it indicates that there is a fault. The management value (maximum) and the management value (minimum) are previously retained in the condition information storage unit 1209. Furthermore, the measurement information used in FIG. 16 is measurement information prepared for the explanation, and it is different from the measurement information explained in the present embodiment.

Figure 17:
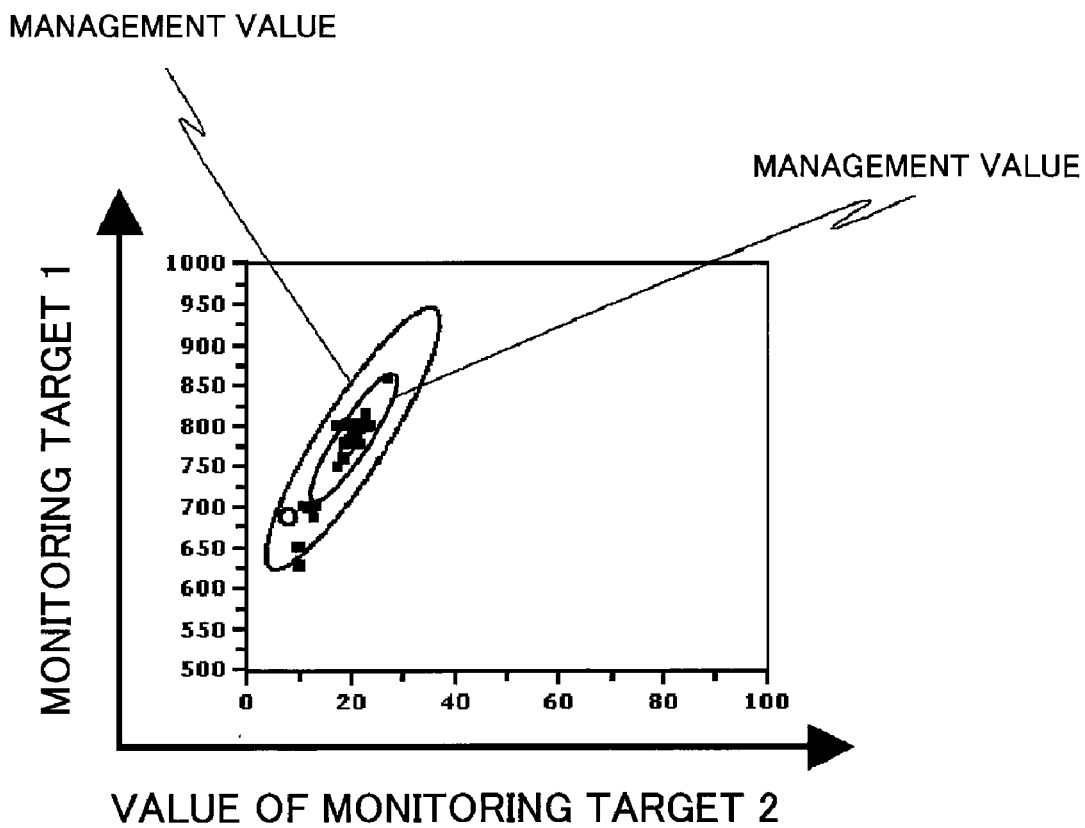
FIG. 17 offers a view of illustrating a display example of the client device of the group management system in accordance with the embodiment of the present invention.

Moreover, in the present embodiment, the outputted chart may be a correlation chart, as shown in FIG. 17, visually distinguishing the measurement information of the different manufacturing apparatus identifiers or the different recipe identifiers or both of them among a plurality of measurement information read from the measurement information storage unit 1201 to be coincident with an output instruction which is an instruction for outputting a correlation chart, and showing a correlation between two kinds of measurement information (for example, the temperature and the pressure, and the like). Further, the correlation chart shown in FIG. 17 is a chart including, for example, two kinds of measurement information of a single apparatus identifier. Further, on the correlation chart shown in FIG. 17, two management values are outputted. When a certain measurement value is out of the range of the two management values, it indicates that there is a fault. Furthermore, the measurement information used in FIG. 17 is measurement information prepared for the explanation, and it is different from the measurement information explained in the present embodiment.

Figure 18:
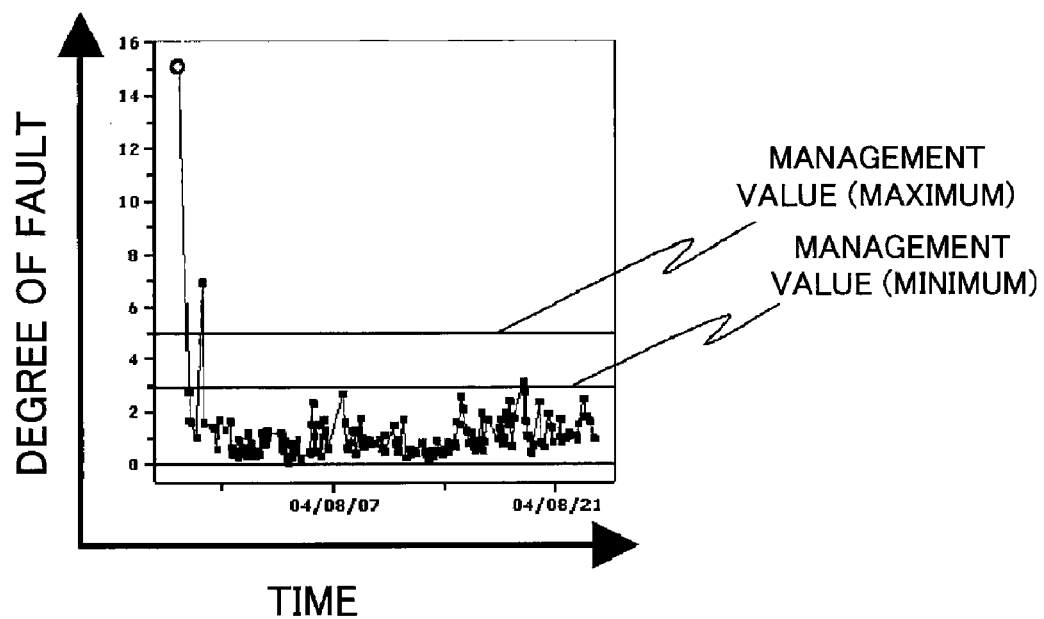
FIG. 18 is a view of showing a display example of the client device of the group management system in accordance with the embodiment of the present invention.

In addition, in the present embodiment, the outputted chart may be an MD chart, as illustrated in FIG. 18, visually distinguishing the measurement information of the different manufacturing apparatus identifiers or the different recipe identifiers or both of them among a plurality of measurement information, which is read from the measurement information storage unit 1201 and includes any one of the one or more manufacturing apparatus identifiers or any one of the one or more recipe identifiers, or any one of the one or more manufacturing apparatus identifiers and any one of the one or more recipe identifiers contained in an output instruction which is an instruction for outputting an MD (Mahalanobis Distance) chart, and showing a correlation between three or more kinds of measurement information (for example, the gas flow rate, the pressure and the temperature at two locations). Further, the MD chart shown in FIG. 18, may be a chart including, for example, measurement information of a single manufacturing apparatus identifier. Furthermore, the MD chart shown in FIG. 18 is a chart in which a fault determination is carried out by using a Mahalanobis distance. To be more specific, the MD chart illustrated in FIG. 18 is a chart which modelizes data in a normal state and shows a degree of fault as a numerical value by using the Mahalanobis distance. Further, on the MD chart shown in FIG. 18, two management values are outputted. When a certain measurement value is out of the range of the two management values, it indicates that there is a fault. Furthermore, the measurement information used in FIG. 18 is measurement information prepared for the explanation, and it is different from the measurement information explained in the present embodiment.

Figure 19:
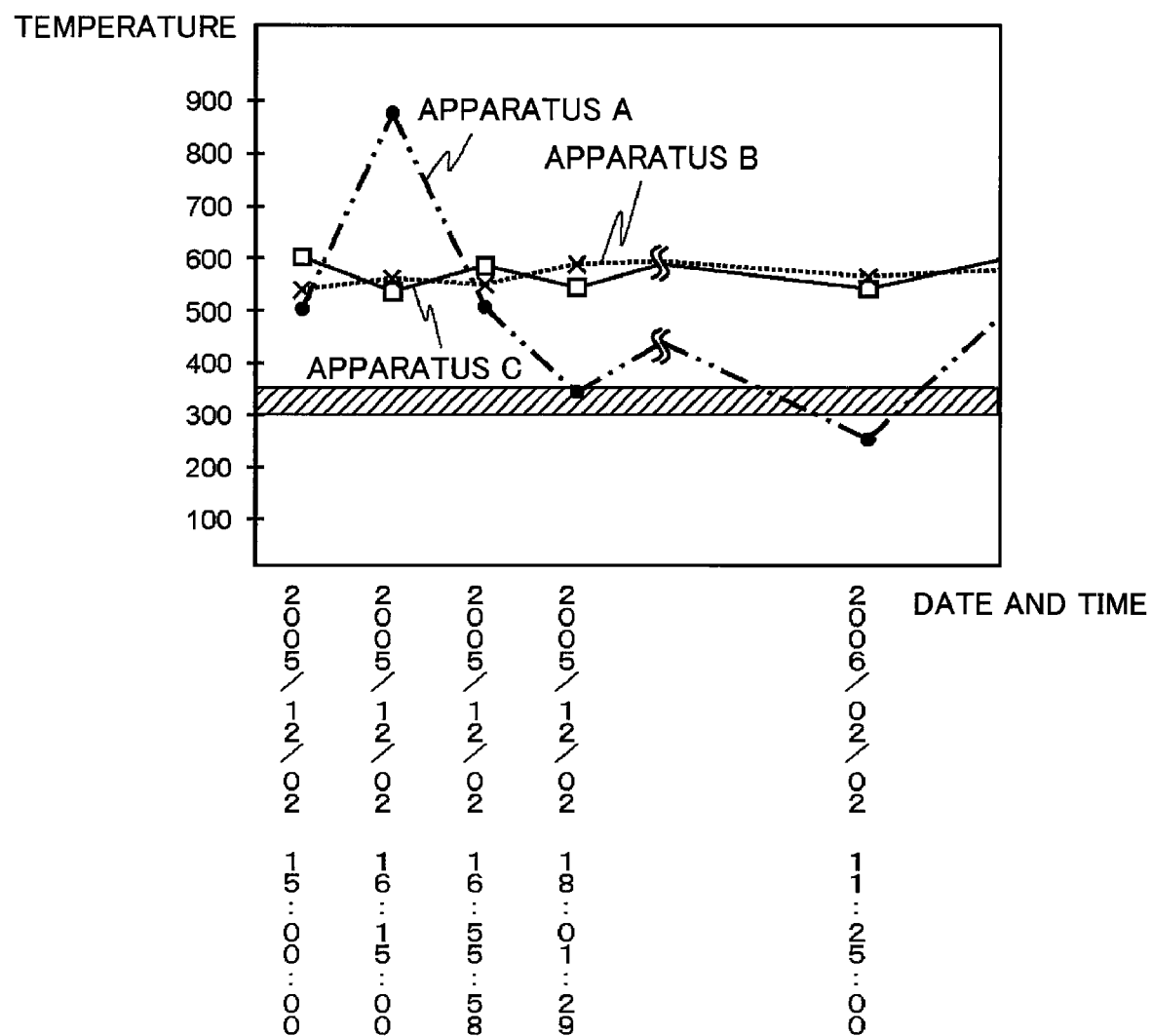
FIG. 19 shows a diagram of illustrating a display example of the client device of the group management system in accordance with the embodiment of the present invention.

Further, in the example of the present embodiment, the outputted chart is the single line graph showing the measurement information of the one manufacturing apparatus identifier or the one recipe identifier and connecting the read plurality of measurement information according to the time sequence indicated by the time information contained in any one kind of measurement information. However, the outputted chart may be, as shown in FIG. 19, three individual charts visually distinguishing the measurement information of different manufacturing apparatus identifiers among a plurality of measurement information read from the measurement information storage unit 1201 and having three manufacturing apparatus identifiers contained in an output instruction, and plotting the read plurality of measurement information according to a time sequence indicated by time information contained in any one kind of measurement information. In this case, the output instruction includes three apparatus identifiers, for example, [apparatus A], [apparatus B] and [apparatus C]. The measurement information acquisition unit 1203 acquires measurement information three times by searching the measurement information storage unit 1201 three times by means of using each of [apparatus A], [apparatus B] and [apparatus C] as a key, and the output information composing unit 1206 composes, for each key, a chart having different property values of dots or lines, thus obtaining the three charts. Then, the three charts are outputted. Furthermore, the measurement information used in FIG. 19 is measurement information prepared for the explanation, and it is different from the measurement information explained in the present embodiment.

In the present embodiment, since the display type of the three or more charts (the SPC chart, the correlation chart, the MD chart, and the like) can be freely selected as described above, an analysis of the monitoring result or a monitoring in various aspects is enabled Moreover, in the example of the present embodiment, it may be possible that the raw information or the measurement information is previously retained in the server device 12. In such case, the raw information or the measurement information is acquired from the manufacturing apparatuses 11 by a non-illustrated means and transmitted to the server device 12 via a storage medium or the like Furthermore, in the present embodiment, it may be desirable that the user inputs an instruction for enlarging a portion of a chart under observation and changes a scale of a part of the chart (changes a time interval of measurement information or an interval of steps), and then outputs the chart Further, in the present embodiment, it may be possible that the measurement information has the same constitution as the raw information. In such case, the measurement information accumulation unit becomes unnecessary Furthermore, in the present embodiment, a transception of the raw information between the manufacturing apparatuses and the server device is not essential. The raw information can be sent to the server device from the manufacturing apparatuses via, for example, a storage medium In addition, in the present embodiment, the group management system may not have the client device 13. In such case, the user may input an instruction such as an output instruction and the like on the server device 12

Further, in the example of the present embodiment, though the charts are outputted by designating the manufacturing apparatus identifier or the recipe identifier, it may be also possible to output a chart by designating one or more manufacturing apparatus identifiers and one or more recipe identifiers. In case that the user inputs an output instruction including the one or more manufacturing apparatus identifiers and the one or more recipe identifiers, the fault detection unit 1210 searches for measurement information (or raw information) by using each of the designated one or more manufacturing apparatus identifiers and one or more recipe identifiers as a key and detects a fault therefrom, and the output information composing unit 1206 composes a chart.

Besides, in the present embodiment, in case that the manufacturing apparatus is configured to transmit the raw information in sequence to the server device 12 whenever the raw information is acquired, it may be very desirable to perform on a real-time basis a fault detection process or an acquisition of the measurement information by being triggered upon receiving the output instruction by the instruction receiving unit of the server device and to update the output information (chart and the like) whenever the raw information is received because the user can be informed of a fault as soon as the fault occurs. Further, such real-time fault detection can be carried out as follows. That is, the fault detection unit immediately determines whether the measurement information, continuously acquired by the measurement information acquisition unit, satisfies the condition information, and the output information composing unit continuously composes the output information according to a determination result of the fault detection unit, and the output unit outputs the output information composed by the output information composing unit, while updating them.

In addition, in accordance with each embodiment, it is possible to perform each process (each function) through centralized processing by a single apparatus (system), or through distributed processing by a plurality of apparatuses.

Moreover, the components in each of the above-stated embodiments may be embodied as a dedicated hardware, or the components executable by software may be realized by executing a program. For example, a program executing unit such as a CPU or the like reads and executes a software program stored in a storage medium, e.g., a hard disk, a semiconductor memory, or the like, whereby each of the components can be realized. Further, software for realizing the server device in each of the embodiments is a program as follows. That is, a program for executing on a computer: an instruction receiving step for receiving an output instruction of plural measurement information, which is stored in a measurement information storage unit and is time sequential information measured in one or more manufacturing apparatuses for performing a predetermined process on a target substrate and has a measurement value obtained by performing a predetermined recipe by the manufacturing apparatuses and time information indicating time; a measurement information acquiring step for acquiring, from the measurement information storage unit, measurement information designated by the output instruction; an output information composing step for composing output information by using the acquired measurement information; and an outputting step for outputting the output information composed in the output information composing step, wherein the recipe includes one or more sub-recipes, the output instruction received in the instruction receiving step includes an instruction for designating one or more desired number of times of execution of a sub-recipe among plural number of times of execution of the sub-recipe in the recipe, and in the measurement information acquiring step, measurement information corresponding to the sub-recipe designated by the output instruction is acquired.

Further, in the measurement information acquiring step of the program, there is counted the number of times of new appearances of a measurement information group corresponding to the sub-recipe which is designated by the output instruction and executed plural times with respect to the measurement information stored in the measurement information storage unit and there is acquired one or more measurement information included in the measurement information group when the counted number is identical with the desired number of times designated by the output instruction.

Furthermore, the sub-recipe includes two or more steps of the program, and in the measurement information acquiring step, when two or more measurement information corresponding to the two or more steps constituting the sub-recipe appears repeatedly, the repeatedly appeared one or more measurement information is made into the measurement information group corresponding to the sub-recipe executed plural number of times.

Further, in the program, the measurement information includes a sub-recipe identifier for identifying a sub-recipe corresponding to the measurement information, measurement information corresponding to the sub-recipe executed plural number of times includes the same sub-recipe identifier, and in the measurement information acquiring step, there is counted the number of times of new detections of the sub-recipe identifier of the sub-recipe which is designated by the output instruction and executed plural number of times with respect to the measurement information stored in the measurement information storage unit and there is acquired one or more measurement information containing the sub-recipe identifier when the counted number is identical with the desired number of times designated by the output instruction.

Further, in the program, the sub-recipe includes two or more steps, the measurement information corresponding to the sub-recipe includes step identifiers for identifying steps, and in the measurement information acquiring step, a count-up operation is made whenever two or more step identifiers appear repeatedly in consecutive measurement information having the same sub-recipe identifier.

Furthermore, in the instruction receiving step of the program, there is received the output instruction for designating two or more desired number of times of execution of the sub-recipe among the plural number of times of execution of the sub-recipe in the recipe, in the measurement information acquiring step, measurement information corresponding to the sub-recipe executed at two or more different times is acquired, and in the output information composing step, there is composed the output information resulted from a predetermined calculation performed on the measurement information having the same time elapsed from a predetermined start point in each sub-recipe among the measurement information corresponding to the sub-recipe executed at the two or more different times acquired in the measurement information acquiring step.

Further, in an information transmitting step or an information receiving step, a process executed by hardware, for example, a process executed by a modem, an interface card or the like (a process executed only by hardware) during the transmitting step is not included in the above-mentioned program Further, the program may be executed by being downloaded from a server or the like, or by reading the program stored in a predetermined storage medium (e.g., an optical disc such as CD-ROM and the like, a magnetic disc and a semiconductor memory).

Further, one or more computers can be used to execute the program. That is, centralized processing or distributed processing can be performed.

Further, in each embodiment, two or more communication means (the raw information receiving unit, the output unit, or the like) in a single apparatus can be implemented physically by a single means.

The present invention is not limited to the above-mentioned embodiments and can be modified in various ways, and it shall be understood that all the modifications are included in the scope of the present invention.

Furthermore, in each of the above-stated embodiments, though there has been explained a case where the server device is a stand-alone device, the server device may be the stand-alone device or a server device in a server-client system. In the latter case, the output unit or the receiving unit outputs a screen or receives an input through a communication line.

INDUSTRIAL APPLICABILITY

As stated above, the server device or the like in accordance with the present invention is suitable as a server device in a group management system including one or more manufacturing apparatuses for performing a preset process on a target substrate and the server device connected to the one or more manufacturing apparatuses, and in particular, it is advantageous as a server device for selectively outputting measurement information and the like acquired in a recipe.

What is claimed is:

1. A server device constituting a group management system, which includes one or more manufacturing apparatuses for performing a preset process on a target substrate and the server device connected with the one or more manufacturing apparatuses and has a function of performing a fault detection, the server device comprising:
    a measurement information storage unit for storing therein plural measurement information, which is time sequential information measured in the one or more manufacturing apparatuses and has a measurement value obtained by executing a predetermined recipe by the manufacturing apparatuses and time information indicating time;
    an instruction receiving unit for receiving an output instruction of the measurement information;
    a measurement information acquisition unit for acquiring, from the measurement information storage unit, measurement information designated by the output instruction;
    an output information composing unit for composing output information by using the acquired measurement information; and
    an output unit for outputting the output information composed by the output information composing unit,
    wherein the recipe includes one or more sub-recipes,
    the output instruction received by the instruction receiving unit includes an instruction for designating one or more desired number of times of execution of a sub-recipe among plural number of times of execution of the sub-recipe in the recipe, and
    the measurement information acquisition unit acquires measurement information corresponding to the sub-recipe designated by the output instruction.

2. The server device of claim 1, wherein the measurement information acquisition unit counts the number of times of new appearances of a measurement information group corresponding to the sub-recipe which is designated by the output instruction and executed plural times with respect to the measurement information stored in the measurement information storage unit, and acquires one or more measurement information included in the measurement information group when the counted number is identical with the desired number of times designated by the output instruction.

3. The server device of claim 2, wherein when two or more measurement information corresponding to two or more steps constituting the sub-recipe appears repeatedly, the measurement information acquisition unit makes the repeatedly appeared one or more measurement information into the measurement information group corresponding to the sub-recipe executed plural number of times.

4. The server device of claim 1, wherein the measurement information includes a sub-recipe identifier for identifying a sub-recipe corresponding to the measurement information,
the measurement information corresponding to the sub-recipe executed plural number of times includes the same sub-recipe identifier, and
the measurement information acquisition unit counts the number of times of new detections of the sub-recipe identifier of the sub-recipe which is designated by the output instruction and executed plural number of times with respect to the measurement information stored in the measurement information storage unit, and acquires one or more measurement information containing the sub-recipe identifier when the counted number is identical with the desired number of times designated by the output instruction.

5. The server device of claim 4, wherein the sub-recipe includes two or more steps,
the measurement information corresponding to the sub-recipe includes step identifiers for identifying the steps, and
the measurement information acquisition unit makes a count-up operation whenever two or more step identifiers repeatedly appear in consecutive measurement information having the same sub-recipe identifier.

6. The server device of claim 1, wherein the instruction receiving unit receives the output instruction for designating two or more desired number of times of execution of the sub-recipe among the plural number of times of execution of the sub-recipe in the recipe,
the measurement information acquisition unit acquires measurement information corresponding to the sub-recipe executed at two or more different times, and
the output information composition unit composes the output information resulted from a predetermined calculation performed on the measurement information having the same time elapsed from a predetermined start point in each sub-recipe among the measurement information corresponding to the sub-recipe executed at the two or more different times acquired by the measurement information acquisition unit.

7. The server device of claim 1, wherein the output information composing unit composes an SPC chart which is a chart plotting the acquired measurement information according to a time sequence indicated by the time information contained in the measurement information, and
the output unit outputs the SPC chart composed by the output information composing unit.

8. The server device of claim 1, wherein the output information composing unit composes a correlation chart which is a chart showing a correlation between two kinds of measurement information from the acquired measurement information, and
the output unit outputs the correlation chart composed by the output information composing unit.

9. The server device of claim 1, wherein the output information composing unit composes a MD (Mahalanobis Distance) chart which is a chart showing a correlation among three or more kinds of measurement information from the acquired measurement information, and
the output unit outputs the MD chart composed by the output information composing unit.

10. A program for executing on a computer:
an instruction receiving step for receiving an output instruction of plural measurement information, which is stored in a measurement information storage unit and is time sequential information measured in one or more manufacturing apparatuses for performing a predetermined process on a target substrate and has a measurement value obtained by performing a predetermined recipe by the manufacturing apparatuses and time information indicating time;
a measurement information acquiring step for acquiring, from the measurement information storage unit, measurement information designated by the output instruction;
an output information composing step for composing output information by using the acquired measurement information; and
an outputting step for outputting the output information composed in the output information composing step,
wherein the recipe includes one or more sub-recipes,
the output instruction received in the instruction receiving step includes an instruction for designating one or more desired number of times of execution of a sub-recipe among plural number of times of execution of the sub-recipe in the recipe, and
in the measurement information acquiring step, measurement information corresponding to the sub-recipe designated by the output instruction is acquired.

11. The program of claim 10, wherein, in the measurement information acquiring step, there is counted the number of times of new appearances of a measurement information group corresponding to the sub-recipe which is designated by the output instruction and executed plural times with respect to the measurement information stored in the measurement information storage unit and there is acquired one or more measurement information included in the measurement information group when the counted number is identical with the desired number of times designated by the output instruction.

12. The program of claim 11, wherein the sub-recipe includes two or more steps, and
in the measurement information acquiring step, when two or more measurement information corresponding to the two or more steps constituting the sub-recipe appears repeatedly, the repeatedly appeared one or more measurement information is made into the measurement information group corresponding to the sub-recipe executed plural number of times.

13. The program of claim 10, wherein the measurement information includes a sub-recipe identifier for identifying a sub-recipe corresponding to the measurement information,
measurement information corresponding to the sub-recipe executed plural number of times includes the same sub-recipe identifier, and
in the measurement information acquiring step, there is counted the number of times of new detections of the sub-recipe identifier of the sub-recipe which is designated by the output instruction and executed plural number of times with respect to the measurement information stored in the measurement information storage unit and there is acquired one or more measurement information containing the sub-recipe identifier when the counted number is identical with the desired number of times designated by the output instruction.

14. The program of claim 13, wherein the sub-recipe includes two or more steps, the measurement information corresponding to the sub-recipe includes step identifiers for identifying steps, and in the measurement information acquiring step, a count-up operation is made whenever two or more step identifiers appear repeatedly in consecutive measurement information having the same sub-recipe identifier.

15. The program of claim 10, wherein, in the instruction receiving step, there is received the output instruction for designating two or more desired number of times of execution of the sub-recipe among the plural number of times of execution of the sub-recipe in the recipe, in the measurement information acquiring step, measurement information corresponding to the sub-recipe executed at two or more different times is acquired, and in the output information composing step, there is composed the output information resulted from a predetermined calculation performed on the measurement information having the same time elapsed from a predetermined start point in each sub-recipe among the measurement information corresponding to the sub-recipe executed at the two or more different times acquired in the measurement information acquiring step.

* * * * *